(12) United States Patent
Deutsch et al.

(10) Patent No.: US 10,927,466 B2
(45) Date of Patent: Feb. 23, 2021

(54) PASSIVATING WINDOW AND CAPPING LAYER FOR PHOTOELECTROCHEMICAL CELLS

(71) Applicant: Alliance for Sustainable Energy, LLC, Golden, CO (US)

(72) Inventors: Todd Gregory Deutsch, Westminster, CO (US); Myles Aaron Steiner, Denver, CO (US); Daniel Joseph Friedman, Lakewood, CO (US); James Luke Young, Golden, CO (US); Ryan Matthew France, Golden, CO (US); John A. Turner, Broomfield, CO (US); Henning Döscher, Berlin (DE)

(73) Assignee: Alliance for Sustainable Energy, LLC, Golden, CO (US)

( * ) Notice: Subject to any disclaimer, the term of this patent is extended or adjusted under 35 U.S.C. 154(b) by 185 days.

(21) Appl. No.: 15/677,282

(22) Filed: Aug. 15, 2017

(65) Prior Publication Data
US 2018/0051379 A1    Feb. 22, 2018

Related U.S. Application Data

(60) Provisional application No. 62/375,718, filed on Aug. 16, 2016.

(51) Int. Cl.
*C25B 11/051*    (2021.01)
*C30B 25/18*    (2006.01)
(Continued)

(52) U.S. Cl.
CPC .............. *C25B 11/051* (2021.01); *C25B 1/04* (2013.01); *C25B 1/55* (2021.01); *C25B 11/057* (2021.01);
(Continued)

(58) Field of Classification Search
CPC ..... C25B 1/003; C25B 11/00; C25B 11/0405; C25B 11/041; C25B 11/0426–0431;
(Continued)

(56) References Cited

U.S. PATENT DOCUMENTS

2013/0061921 A1* 3/2013 Masson ............... H01L 31/0201
                                                136/256
2014/0261611 A1* 9/2014 King ............... H01L 31/035209
                                                136/244
(Continued)

OTHER PUBLICATIONS

May et al ("Efficient direct solar-to-hydrogen conversion by in situ interface transformation of a tandem structure", Nature Communications, 2015). (Year: 2015).*
(Continued)

*Primary Examiner* — Alexander W Keeling
(74) *Attorney, Agent, or Firm* — Michael A. McIntyre

(57) ABSTRACT

An aspect of the present disclosure is a photoelectrochemical device that includes a first cell that includes a first semiconductor alloy, a capping layer that includes a second semiconductor alloy, and a passivating layer that includes a third semiconductor alloy, where the passivating layer is positioned between the first cell and the capping layer, and at least a portion of the capping layer is configured to be in direct contact with an electrolyte.

11 Claims, 22 Drawing Sheets

(51) Int. Cl.
*H01L 31/0216* (2014.01)
*H01L 31/0304* (2006.01)
*H01L 31/18* (2006.01)
*C30B 29/40* (2006.01)
*C25B 11/057* (2021.01)
*C25B 11/075* (2021.01)
*C25B 1/04* (2021.01)
*H01G 9/20* (2006.01)
*C25B 1/55* (2021.01)

(52) U.S. Cl.
CPC .......... *C25B 11/075* (2021.01); *C30B 25/18* (2013.01); *C30B 29/40* (2013.01); *H01G 9/205* (2013.01); *H01G 9/2077* (2013.01); *H01L 31/02167* (2013.01); *H01L 31/03046* (2013.01); *H01L 31/1844* (2013.01); *H01L 31/1868* (2013.01); *Y02E 60/36* (2013.01); *Y02P 20/133* (2015.11)

(58) Field of Classification Search
CPC ... C25B 11/0442; C25B 11/0478–0494; C25B 11/04–047; C25B 11/048–049; C25B 11/051–097; H01L 31/0224–022491; H01G 9/20–2095
See application file for complete search history.

(56) References Cited

U.S. PATENT DOCUMENTS

2014/0332374 A1   11/2014  Deutsch et al.
2015/0325733 A1*  11/2015  Hoffman, Jr. ... H01L 31/022425
                                                      136/246
2017/0170355 A1*   6/2017  Stan ................... H01L 31/0203

OTHER PUBLICATIONS

Geisz ("High-efficiency GaInP/GaAw/InGaAs triplejunction solar cells grown inverted with a metamorphic bottom junction", Applied Physics Letters, 91, 2007, pp. 023502-0-023502-3) (Year: 2007).*
Walter et al ("Solar Water Splitting Cells", Chemical Reviews, 2010, 110, pp. 6446-6473) (Year: 2010).*
BATOP ("Energy band gap Eg of AlxGa1—xAs alloys", 2010) (Year: 2010).*
Steiner et al ("Optical enhancement of the open-circuit voltage in high quality GaAs solar cells", Journal of Applied Physics, 113, 123109, 2013) (Year: 2013).*
Geisz et al ("Enhanced external radiative efficiency for 20.8% efficient single-junction GaInP solar cells", Applied Physics Letters, 103, 041118, 2013, referred to as Kurtz herein) (Year: 2013).*
Kawait et al ("Npn and Pnp GaInP/GaAs Heterojunction Bipolar Transistors Grown by MOVCD", Electronics Letters, vol. 25, No. 9, 1989, pp. 609-610) (Year: 1989).*
Asher ("Secondary Ion Mass Spectrometry", Microanalysis of Solids. edited by B.G. Yacobi, D.B. Holt, L L Kazmerski, L.L. Kazmerski Springer Science & Business Media, Jun. 29, pp. 149-177, 2013) (Year: 2013).*
Lantratov et al ("High-Efficiency Dual-Junction GaInP/GaAs Tandem Solar Cells Obtained by the Method of Mocvd", Physics of Semiconductor Devices, 2007, vol. 41, No. 6, pp. 727-731) (Year: 2007).*
Perl et al ("Design of antireflective nanostructures and optical coatings for next-generation multijunction photovoltaic devices", Optics Express, vol. 22, No. S5, 2014, pp. A1243-A1256). (Year: 2014).*
Bertness et al ("29.5%-efficient GaInP/GaAs tandem solar cells", Applied Physics Letters, 65, 8, pp. 989-991, 1994). (Year: 1994).*
Wheeldon et al ("Performance comparison of AlGaAs, GaAs and InGaP tunnel junctions for concentrated multijunction solar cells", Progress in Photovoltaics: Research and Applications, 19, 2010 pp. 442-452) (Year: 2010).*

Jun et al ("Numerical Simulation of GaInP/AlInP Window Layer for High Concentration Photovoltaic Cells", AIP Conference Proceedings, 1277, 32, 2010). (Year: 2010).*
Ager, J. et al., "Experimental demonstrations of spontaneous, solar-driven photoelectrochemical water splitting," Energy & Environmental Science, vol. 8, No. 10, 2015, pp. 2811-2824.
Bansal, A. et al., "Suppression of Band Edge Migration at the p—GaInP$_2$/H$_2$O Interface under Illumination via Catalysis," Journal of Physical Chemistry B, vol. 104, 2000, pp. 6591-6598.
Boettcher, S. et al., "Photoelectrochemical Hydrogen Evolution Using Si Microwire Arrays," Journal of the American Chemical Society, vol. 133, 2011, pp. 1216-1219.
Dameron, A. et al., "Pt—Ru Alloyed Fuel Cell Catalysts Sputtered from a Single Alloyed Target," American Chemical Society Catalysis, vol. 1, 2011, pp. 1307-1315.
Döscher, H. et al., "Solar-to-hydrogen efficiency: shining light on photoelectrochemical device performance," Energy & Environmental Science, vol. 9, 2016, pp. 74-80.
Döscher, H. et al., "Sunlight absorption in water-efficiency and design implications for photoelectrochemical devices," Energy & Environmental Science, vol. 7, 2014, pp. 2951-2956.
Fernandez, J. et al., "Advanced Concepts for High-Efficiency Germanium Photovoltaic Cells," IEEE, 2008, 4 pages.
Geisz, J. et al., "High-efficiency GaInP/GaAs/InGaAs triple-junction solar cells grown inverted with a metamorphic bottom junction," Applied Physics Letters, vol. 91, 2007, pp. 023502-1 through 023502-3.
Heller, A. et al., An Efficient Photocathode for Semiconductor Liquid Junction Cells: 9.4% Solar Conversion Efficiency with p—InP/VCl$_3$-VCl$_2$-HCl/C; Journal of the American Chemical Society, vol. 102, 1980, pp. 6555-6556.
Hu, S. et al., "Thin-Film Materials for the Protection of Semiconducting Photoelectrodes in Solar-Fuel Generators," Journal of Physical Chemistry, vol. 119, 2015, pp. 24201-24228.
Jain, N. et al., "Development of Lattice-Matched 1.7 eV GaInAsP Solar Cells grown on GaAs by MOVPE," 43rd IEEE Photovoltaics Specialists Conference, 2016, pp. 0046-0051.
Kemppainen, E. et al., "Scalability and feasibility of photoelectrochemical H$_2$ evolution: the ultimate limit of Pt nanoparticle as an HER catalyst," Energy & Environmental Science, vol. 8, 2015, pp. 2991-2999.
Khaselev, O. et al., "A Monolithic Photovoltaic-Photoelectrochemical Device for Hydrogen Production via Water Splitting," Science, vol. 280, Apr. 17, 1998, pp. 425-427.
Liu, R. et al., "Enhanced photoelectrochemical water-splitting performance of semiconductors by surface passivation layers," Energy & Environmental Science, vol. 7, 2014, pp. 2504-2517.
May, M. et al., "Efficient direct solar-to-hydrogen conversion by in situ interface transformation of a tandem structure," Nature Communications, vol. 6, 2015, pp. 1-7.
Murphy, A. et al., "Efficiency of solar water splitting using semiconductor electrodes," International Journal of Hydrogen Energy, vol. 31, 2006, pp. 1999-2017.
Nielander, A. et al., "A taxonomy for solar fuels generators," Energy & Environmental Science, vol. 8, 2015, pp. 16-25.
Rosenwaks, Y. et al., "The GaAs/GaInP$_2$ heterojunction for studying photoinduced charge transfer processes," Applied Surface Science, vol. 106, 1996, pp. 396-401.
Steiner, M. et al., "Optical enhancement of the open-circuit voltage in high quality GaAs solar cells," Journal of Applied Physics, vol. 113, 2013, pp. 123109-1 through 123109-11.
Woodhouse, M. et al., A Manufacturing Cost Analysis Relevant to Single- and Dual-Junction Photovoltaic Cells Fabricated with III-Vs and III-Vs Grown on *Czochralski* Silicon, NREL Publication No. NREL/PR-6A20-60126; Sep. 30, 2013, 92 pages.
Young, J. et al., "Remarkable stability of unmodified GaAs photocathodes during hydrogen evolution in acidic electrolyte," Journal of Materials Chemistry A, vol. 4, 2016, pp. 2831-2836.

* cited by examiner

US 10,927,466 B2

PASSIVATING WINDOW AND CAPPING LAYER FOR PHOTOELECTROCHEMICAL CELLS

CROSS-REFERENCE TO RELATED APPLICATIONS

This application claims the benefit of U.S. Provisional Application No. 62/375,718 filed Aug. 16, 2016, the contents of which is incorporated herein by reference in their entirety.

CONTRACTUAL ORIGIN

The United States Government has rights in this disclosure under Contract No. DE-AC36-08GO28308 between the United States Department of Energy and the Alliance for Sustainable Energy, LLC, the Manager and Operator of the National Renewable Energy Laboratory.

BACKGROUND

A sustainable energy economy depends critically on using renewable energy resources whose variability requires a storage mechanism. Solar energy is the most abundant source and pathways for conversion to fuels represent crucial areas of research. A photoelectrochemical (PEC) cell is a semiconductor-based device designed to convert the energy contained in sunlight into chemical bonds. The most commonly studied PEC cells split water to generate hydrogen ($H_2$) and use the oxidation of water to oxygen as the electron source. Solar water-splitting via multijunction semiconductor photoelectrochemical cells provides direct conversion of solar energy to stored chemical energy as hydrogen bonds. Economical hydrogen production demands high conversion efficiency to reduce balance-of-systems costs. For sufficient photovoltage, water-splitting efficiency is proportional to the device photocurrent, which can be tuned by judicious selection and integration of optimal semiconductor bandgaps. Hydrogen is storable and transportable, a feedstock for ammonia fertilizer essential to global food supply, and a necessary input for liquid fuels produced via $CO_2$ capture and reduction. Hydrogen fuel is an elegant choice for transportation and energy storage because, when consumed in a fuel cell, it efficiently provides electricity and heat with water as the only emission.

The U.S. Department of Energy has an ultimate cost target of $2/kg for the production of hydrogen from PEC pathways. Recent analysis suggests that a solar-to-hydrogen efficiency ($\eta_{STH}$) of 10% is the breakeven point for energy return on investment. Improvements in efficiency translate directly to an increased rate of hydrogen production, but also significantly reduce capital expenditures of land and balance-of-systems costs. For example, the solar capture area necessary to produce 1 metric ton of hydrogen per day—enough to fill 200 fuel-cell vehicles each with a 350-mile range—is equivalent to about five, four, and three football fields for $\eta_{STH}$=15%, 20%, and 25%, respectively. Clearly, high $\eta_{STH}$ is critical for cost-effective hydrogen production.

Current photoelectrochemical cells for water-splitting often demonstrate low conversion efficiencies ($\eta_{STH}$) due to various factors including current-matching requirements, transmission losses through the device's electrolyte, and device durability/stability issues. Thus, there remains a need for improved PEC cells.

SUMMARY

An aspect of the present disclosure is a photoelectrochemical device that includes a first cell that includes a first semiconductor alloy, a capping layer that includes a second semiconductor alloy, and a passivating layer that includes a third semiconductor alloy, where the passivating layer is positioned between the first cell and the capping layer, and at least a portion of the capping layer is configured to be in direct contact with an electrolyte.

In some embodiments of the present disclosure, the second semiconductor alloy may include a first Group III-V alloy. In some embodiments of the present disclosure, the first Group III-V alloy may include at least one of a binary alloy, a tertiary alloy, and/or a quaternary alloy. In some embodiments of the present disclosure, the first Group III-V alloy may include $A_xB_yE_{(1-x-y)}C$ or $AC_xD_yF_{(1-x-y)}$, where A may be a first Group III element, B may be a second Group III element, E may be a third Group III element, C may be a first Group V element, D may be a second Group V element, F may be a third Group V element, $0 \le x \le 1$, and $0 \le y \le 1$. In some embodiments of the present disclosure, the first Group III-V alloy may include at least one of BN, BP, BAs, AlN, AlP, AlAs, AlSb, GaN, GaP, GaAs, GaSb, InN, InP, InAs, InSb, AlInSb, GaAsN, GaAsP, GaAsSb, AlGaN, AlGaP, InGaN, InAsSb, InGaSb, GaInP, AlInP, GaSbP, AlGaInP, AlGaAsP, InGaAsP, InGaAsSb, InAsSbP, AlInAsP, AlGaAsN, InGaAsN, InAlAsN, and/or GaAsSbN. In some embodiments of the present disclosure, the first Group III-V alloy may include $Ga_xIn_{(1-x)}P$, $Ga_xIn_{(1-x)}As_yP_{(1-y)}$, and/or $GaSb_xP_{(1-x)}$. In some embodiments of the present disclosure, the first Group III-V alloy may include $Ga_{0.51}In_{0.49}P$, $Ga_{0.68}In_{0.32}As_{0.34}P_{0.66}$, and/or $GaSb_{0.31}P_{0.69}$. In some embodiments of the present disclosure, the first Group III-V alloy may further include at least one of selenium, tellurium, sulfur, and/or silicon. In some embodiments of the present disclosure, the first Group III-V alloy may be n-type.

In some embodiments of the present disclosure, the third semiconductor alloy may include a second Group III-V alloy. In some embodiments of the present disclosure, the second Group III-V alloy may include at least one of a binary alloy, a tertiary alloy, and/or a quaternary alloy. In some embodiments of the present disclosure, the second Group III-V alloy may include $G_uH_vI_{(1-u-v)}J$ or $GJ_uK_vL_{(1-u-v)}$, where G may be a fourth Group III element, H may be a fifth Group III element, I may be a sixth Group III element, J may be a fourth Group V element, K may be a fifth Group V element, L may be a sixth Group V element, $0 \le u \le 1$, and $0 \le v \le 1$. In some embodiments of the present disclosure, the second Group III-V alloy may include at least one of BN, BP, BAs, AlN, AlP, AlAs, AlSb, GaN, GaP, GaAs, GaSb, InN, InP, InAs, InSb, AlInSb, GaAsN, GaAsP, GaAsSb, AlGaN, AlGaP, InGaN, InAsSb, InGaSb, GaInP, AlInP, GaSbP, AlGaInP, AlGaAsP, InGaAsP, InGaAsSb, InAsSbP, AlInAsP, AlGaAsN, InGaAsN, InAlAsN, and/or GaAsSbN. In some embodiments of the present disclosure, the second Group III-V alloy may include $Al_uIn_{(1-u)}P$. In some embodiments of the present disclosure, the second Group III-V alloy may include $Al_{0.53}In_{0.47}P$. In some embodiments of the present disclosure, the second Group III-V alloy may further include at least one of selenium, tellurium, sulfur, and/or silicon. In some embodiments of the present disclosure, the second Group III-V alloy may be n-type.

In some embodiments of the present disclosure, the first cell may include an n-layer and a p-layer, and the n-layer may be between the p-layer and the passivating layer. In some embodiments of the present disclosure, the first semiconductor alloy may include $Ga_xIn_{(1-x)}P$ or $Al_xGa_{(1-x)}As$, where $0 \leq x \leq 1$. In some embodiments of the present disclosure, the first semiconductor alloy may include $Ga_{0.51}In_{0.49}P$ or $Al_{0.23}Ga_{0.77}As$.

An aspect of the present disclosure is a method for producing a photoelectrochemical device, where the method includes growing by an epitaxial method a first cell on a substrate, growing by an epitaxial method a second cell on the first cell, attaching the second cell to a handle, removing the substrate from the first cell, resulting in the exposing of a surface of the first cell, depositing a passivating layer on the surface, and depositing a capping layer on the passivating layer.

BRIEF DESCRIPTION OF THE DRAWINGS

Exemplary embodiments are illustrated in referenced figures of the drawings. It is intended that the embodiments and figures disclosed herein are to be considered illustrative rather than limiting.

Figure 1:
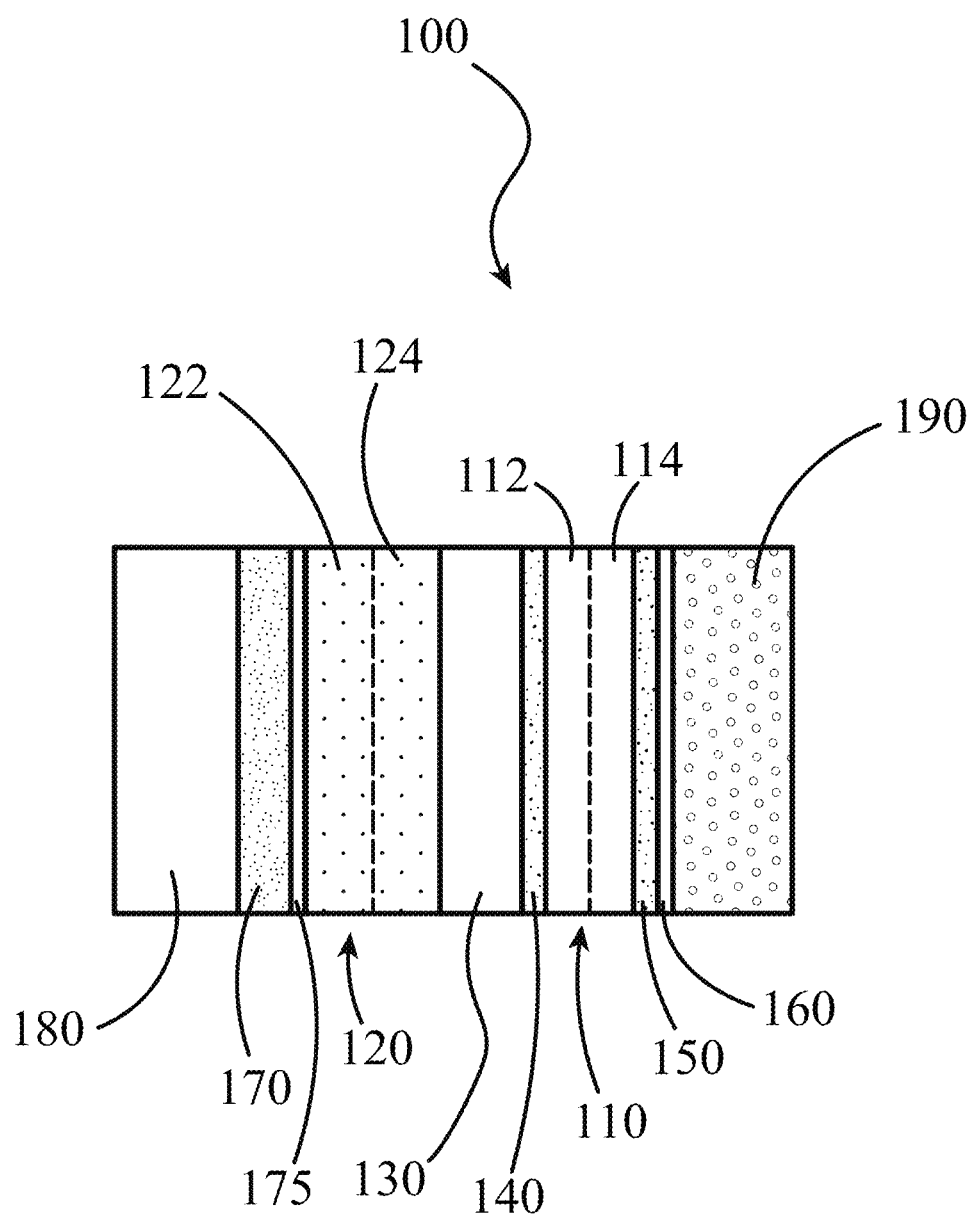
FIG. 1 illustrates a device for photoelectrochemical (PEC) water-splitting, according to some embodiments of the present disclosure.

REFERENCE NUMERALS 100 first electrode
110 first cell
112 p-layer
114 n-layer
120 second cell
122 p-layer
124 n-layer
130 buffer layer
140 tunnel junction
150 passivating layer
160 capping layer
170 adhesive
175 back reflector
180 handle
190 electrolyte
400 device
405 second electrode
420 circuit
430A first wavelength range of light
430B second wavelength range of light
1100 light source
1110 air
1120 glass
1300 system
1310 ion gun
1320 wheel
1330 sputter head
1340 sample stage 1350A first sample
1350B second sample
1900 method
1910 epitaxial growth
1911 electrodepositing
1912 inverting and mounting
1913 removing
1914 sputtering
1915 etching
1916 encapsulating
1920 substrate
1930 catalyst
1940 encapsulation layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

FIG. 1 illustrates a first electrode 100, according to some embodiments of the present disclosure, where the first electrode 100 is configured for water-splitting to produce hydrogen ($H_2$) and oxygen ($O_2$). The first electrode 100 includes a first cell 110 and a second cell 120, both cells constructed of a semiconductor material, with a buffer layer 130 positioned between the first cell 110 and the second cell 120. Each cell (110 and 120) is an "active layer", which absorbs light to produce a voltage and/or current by the photoelectric effect. The electrical energy produced may then be used to drive the overall reaction $2H_2O \rightarrow 2H_2+O_2$. The first cell 110 may include a p-layer 112 and an n-layer 114, resulting in a first pn-junction (e.g. at the dashed-line intersecting the first cell 110). Similarly, the second cell 120 may include a p-layer 122 and an n-layer 124, resulting in a second pn-junction (e.g. at the dashed-line intersecting the second cell 120). As used herein, a "p-layer" is made from a semiconductor material where holes are the majority carrier and electrons are the minority carrier, whereas an "n-layer" is made from a semiconductor material where electrons are the majority carrier and holes are the minority carrier. The buffer layer 130 may be constructed of a single layer of semiconductor material, while in other embodiments the buffer layer 130 may include two or more compositionally graded buffer layers (not shown). Among other things, the buffer layer 130 may reduce strain that may result from lattice-mismatching between the first cell 110 and the second cell 120.

The first cell 110, the second cell 120, and the buffer layer 130 may be constructed using any suitable Group III and Group V elements, resulting in one or more binary, tertiary, and/or quaternary III-V alloys. Group III elements include boron, aluminum, gallium, indium, thallium, and nihonium. Group V elements include nitrogen, phosphorous, arsenic, antimony, and bismuth. Thus, suitable III-V alloys for either the first cell 110 and/or the second cell 120 include GaAs, GaInP, GaInAs, AlInP, and/or AlGaAs. Other alloys potentially suitable for either the first cell 110 and/or the second cell 120 include BN, BP, BAs, AlN, AlP, AlAs, AlSb, GaN, GaP, GaAs, GaSb, InN, InP, InAs, InSb, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, and/or GaAsSbN. So, a ternary (3-component) alloy may be represented by the general equations $A_xB_{1-x}C$ and/or $AC_xD_{1-x}$, where A is a first Group III element, B is a second Group III element, C is a first Group V element, D is a second Group V element, and $0 \leq x \leq 1$. Similarly, a quaternary (4-component) alloy may be represented by the general equations $A_xB_yE_{(1-x-y)}C$ and/or $AC_xD_yF_{(1-x-y)}$, and/or $A_xB_{1-x}C_yD_{1-y}$, where E is a third Group III element, F is a third Group IV element, and $0 \leq y \leq 1$, and the remaining variables are the same as defined above for ternary alloys, and a similar definition applied toward quinary materials may be used in some embodiments of the current disclosure. The buffer layer 130 may be constructed of Group III and Group IV semiconductor alloys, similar and/or identical to those used to construct the first cell 110 and the second cell 120. The first cell 110 may have a nominal composition of $Ga_{0.51}In_{0.49}P$ with ±0.01 on each Group III element. Some embodiments may include a first cell 110 fabricated from AlGaAs with a nominal composition of $Al_{0.23}Ga_{0.77}As$, corresponding to a bandgap of ~1.7 eV, with a tolerance of ±0.05 on the Al and Ga molar fractions. Some embodiments may include a first cell 110 fabricated from GaInAsP with a nominal composition of $Ga_{0.68}In_{0.32}As_{0.34}P_{0.66}$ corresponding to a bandgap of ~1.7 eV, with a tolerance of ±0.02 on the molar elemental compositions.

n-type materials are typically doped with selenium, tellerium, sulfur and/or silicon. p-type materials are typically doped with zinc and/or carbon. The first cell 110 typically may have a thickness in the range of 0.5-2 μm, though thinner or thicker cells might be appropriate in some instances. The second cell 120 typically may have a thickness in the range of 1-3 μm. The graded buffer may include any Group III and/or Group V element, and in some embodiments may be either AlGaInAs or AlGaInP. The elemental combination is flexible as long as the appropriate lattice constant range is spanned from one side of the buffer to the other, and it is also desirable that the graded buffer be transparent to any incident light. The thickness and number of layers of the graded buffer may also vary, and in some embodiments each layer may have a thickness between 0.5 μm and 4 μm and the graded buffer may have between 2 and 20 buffer layers, inclusive.

In some embodiments of the present disclosure, the first electrode 100 may include a tunnel junction 140 positioned between the first cell 110 and the second cell 120. In some embodiments, the tunnel junction 140 may be placed between the first cell 110 and the buffer layer 130, or between the buffer layer 130 and the second cell 120. The tunnel junction may include a carbon-doped p-type $Al_{0.3}Ga_{0.7}As$ layer having a thickness between 20 nm and 80 nm, followed by an n-type GaAs layer having a thickness between 5 nm and 20 nm, followed by an n-type $Al_{0.3}Ga_{0.7}As$ layer having a thickness between 20 nm and 80 nm. In some embodiments, the Al content of the two AlGaAs layers may have a molar concentration between 10% and 70%.

The second cell 120 may be positioned on a back reflector 175, which in turn may be physically attached to a handle 180 by an adhesive 170 positioned between the handle 180 and the back reflector 175. As the name suggests, the back reflector 175, among other things, may redirect any light not absorbed by the first cell 110 and/or the second cell 120 so that the first electrode 100 may absorb the light in a second pass through the first electrode 100, potentially increasing the PEC device (including the first electrode 100, a second electrode (not shown)) efficiency. Thus, the back reflector 175 may be constructed of any material having a suitable thickness to avoid transmission of the light through the back reflector 175 and sufficient reflectivity that the light is not absorbed by the back reflector 175. Suitable materials for the back reflector 175 include gold and silver with thicknesses between 1 μm and 3 μm. The handle 180 may be provided to allow the first electrode 100 to be more easily manipulated during the manufacturing process (see below). Thus, the handle 180 may be constructed of any suitable material having a thickness that provides sufficient mechanical strength and integrity. Suitable materials for the handle 180 include silicon, glass, and/or a smooth metal such as copper, having a thickness between 0.1 mm and 5 mm or between 0.25 mm and 2 mm. The adhesive 170 used to connect the handle 180 to the back reflector 175 may be any suitable adhesive for example an epoxy.

Referring again to FIG. 1, as described in detail below, in some embodiments of the present disclosure, the first electrode 100 may include a passivating layer 150 and a capping layer 160, wherein the passivating layer 150 is in physical contact with the first cell 110 and the passivating layer 150 is positioned between the first cell 110 and the capping layer 160. The capping layer 160 may then be placed in direct physical contact with an electrolyte 190, where the water-splitting reaction to produce $H_2$ occurs at the capping layer/electrolyte interface. In addition, a water-splitting catalyst (not shown) may be provided on the surface of the capping layer 160 to increase the reaction rate (e.g. of $2H^+ + 2e^- \rightarrow H_2$.).

The passivating layer 150 and/or the capping layer 160 may be constructed of any suitable Group III and Group V elements, resulting in one or more binary (2-component), tertiary (3-component), and/or quaternary (4-component) III-V alloys. Group III elements include boron, aluminum, gallium, indium, thallium. Group V elements include nitrogen, phosphorous, arsenic, antimony, bismuth. Thus, suitable III-V alloys for either the passivating layer 150 and/or the capping layer 160 include GaAs, GaInP, GaInAs, AlInP, and/or AlGaAs. Other alloys potentially suitable for either the passivating layer 150 and/or the capping layer 160 include BN, BP, BAs, AlN, AlP, AlAs, AlSb, GaN, GaP, GaAs, GaSb, InN, InP, InAs, InSb, AlInSb, GaAsN, GaAsP, GaAsSb, AlGaN, AlGaP, InGaN, InAsSb, InGaSb, GaInP, AlInP, AlGaInP, AlGaAsP, InGaAsP, InGaAsSb, InAsSbP, AlInAsP, AlGaAsN, InGaAsN, InAlAsN, and/or GaAsSbN. So, a tertiary (3-component) alloy used to construct at least one of the passivating layer 150 and/or the capping layer 160 may be represented by the general equations $A_xB_{1-x}C$ and/or $AC_xD_{1-x}$, where A is a first Group III element, B is a second Group III element, C is a first Group V element, D is a second Group V element, and $0 \le x \le 1$. Similarly, a quaternary (4-component) alloy used to construct at least one of the passivating layer 150 and/or the capping layer 160 may be represented by the general equations $A_xB_yE_{(1-x-y)}C$ and/or $AC_xD_yF_{(1-x-y)}$, where E is a third Group III element, F is a third Group IV element, and $0 \le y \le 1$, and the remaining variables are the same as defined above for tertiary alloys. The passivating layer 150 may be fabricated from n-type $Al_{0.53}In_{0.47}P$ with a nominal thickness between 10 nm and 20 nm. Alloys for the capping layer 160 may include $Ga_{0.51}In_{0.49}P$, $Ga_{0.68}In_{0.32}As_{0.34}P_{0.66}$, and GaInPN with a very small fraction of N that substitutes for P on the group-V sub-lattice. In some embodiments of the present disclosure, $GaSb_{0.31}P_{0.69}$ may be used as a capping layer 160. A capping layer may have a thickness between 10 nm and 20 nm.

An example of a suitable catalyst is PtRu. Water-splitting catalysts may be provided on the surface of the capping layer 160 in a continuous sheet or dispersed as a plurality of non-contiguous areas (e.g. with intervening areas having no catalyst on the capping layer 160), such that at least the catalyst is in physical contact with the electrolyte 190. In some embodiments, at least one of the catalyst, the capping layer, and/or the passivating layer may be in direct contact with the electrolyte. The electrolyte is used to complete the circuit by ionic movement as well as provide reactant for the water-splitting half reactions. Generally, the electrolyte includes at least one acid, for example at least one of $H_2SO_4$, $H_3PO_4$, and/or $HClO_4$ and/or at least one base (e.g. NaOH and/or KOH) but can also be buffered solutions of intermediate pH containing at least one buffer agent, for example, at least one of sulfate, phosphate, and/or carbonate.

Figure 4:
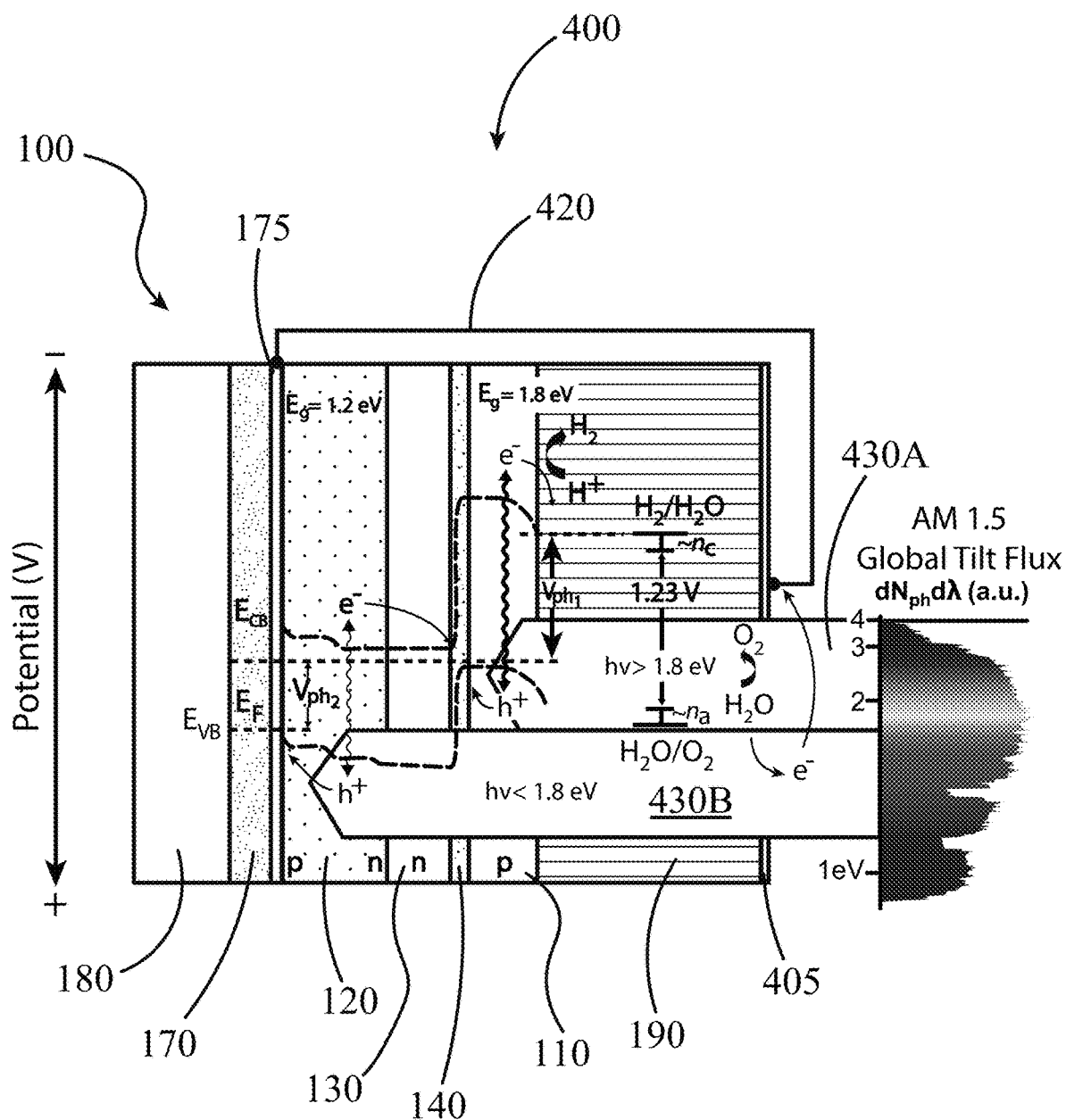
FIG. 4 illustrates a schematic of an inverted metamorphic multi junction (IMM) device configured for water-splitting, according to some embodiments of the present disclosure.

Taken together, the elements used to construct the first electrode 100 illustrated in FIG. 1 result in the first electrode 100 acting as a photocathode, for a PEC device at which the first half-reaction $2e^- + 2H^+ \rightarrow H_2$ can occur at the interface between at least one of the capping layer 160 and/or the catalyst (not shown), when the photocathode is electrically connected to a second electrode (e.g. an anode, not shown) at which the second half-reaction $H_2O \rightarrow 2H^+ + \frac{1}{2} O^{2-} + 2e^-$ can occur (see FIG. 4). Demonstrated herein are unprecedented efficiencies for immersed water-splitting photocathodes (for PEC devices) enabled by inverted metamorphic epitaxy, a transparent compositionally graded buffer layer that allows the bandgap of each cell to be independently varied, and the use of a passivating layer and a capping layer. Voltage losses at the electrolyte/photocathode interface are lowered by 0.55 V compared to uniformly p-doped photocathodes using a buried p-n junction. Advanced on-sun (outdoor exposure to natural sun light) benchmarking, spectral-corrected and validated with incident photon-to-current efficiency, yielded over 16% solar-to-hydrogen efficiency ($\eta_{STH}$) in PEC devices having photocathodes constructed with GaInP/GaInAs tandem active layers (e.g. a first cell 110 and a second cell 120).

Figure 2:
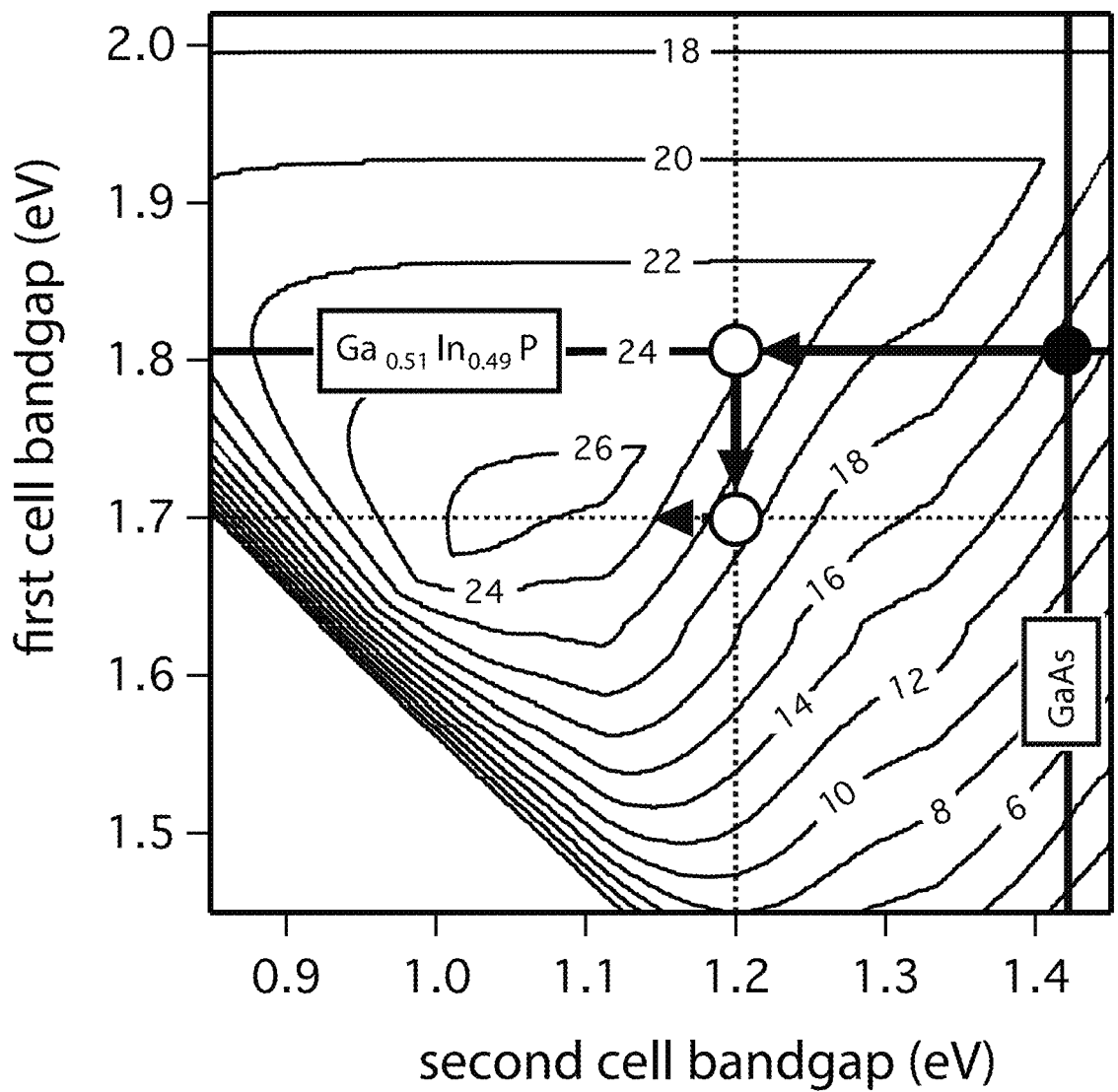
FIG. 2 illustrates theoretical solar-to-hydrogen efficiency limitations in the form of an isoefficiency contour plot of a PEC water-splitting device relevant, according to some embodiments of the present disclosure.

As described herein, improvements in PEC water-splitting devices were systematically advanced from a starting point of a GaInP/GaAs (first cell/second cell) tandem first electrode (black dot in FIG. 2) toward a maximized $\eta_{STH}$ via iterations of tandem first electrodes having 1.8/1.2 eV (top hollow dot in FIG. 2) and 1.7/1.2 eV bandgaps (lower hollow dot in FIG. 2) with limiting efficiencies of $\eta_{STH}$=24% and $\eta_{STH}$=21%, respectively. Since the second cell limited the 1.7/1.2 eV first electrode photocurrent, the thickness of the first cell was decreased to further increase its $\eta_{STH}$. These designs were completed in iterative steps in pursuit of a maximized PEC device constructed with a first electrode having 1.70/1.05 eV (top cell/bottom cell) bandgaps and demonstrating a maximum efficiency, $\eta_{STH}$, of about 27%. Note that the efficiency of this final PEC device was limited by a water film of about 0.2 cm and an overvoltage of about 800 mV.

Figure 3:
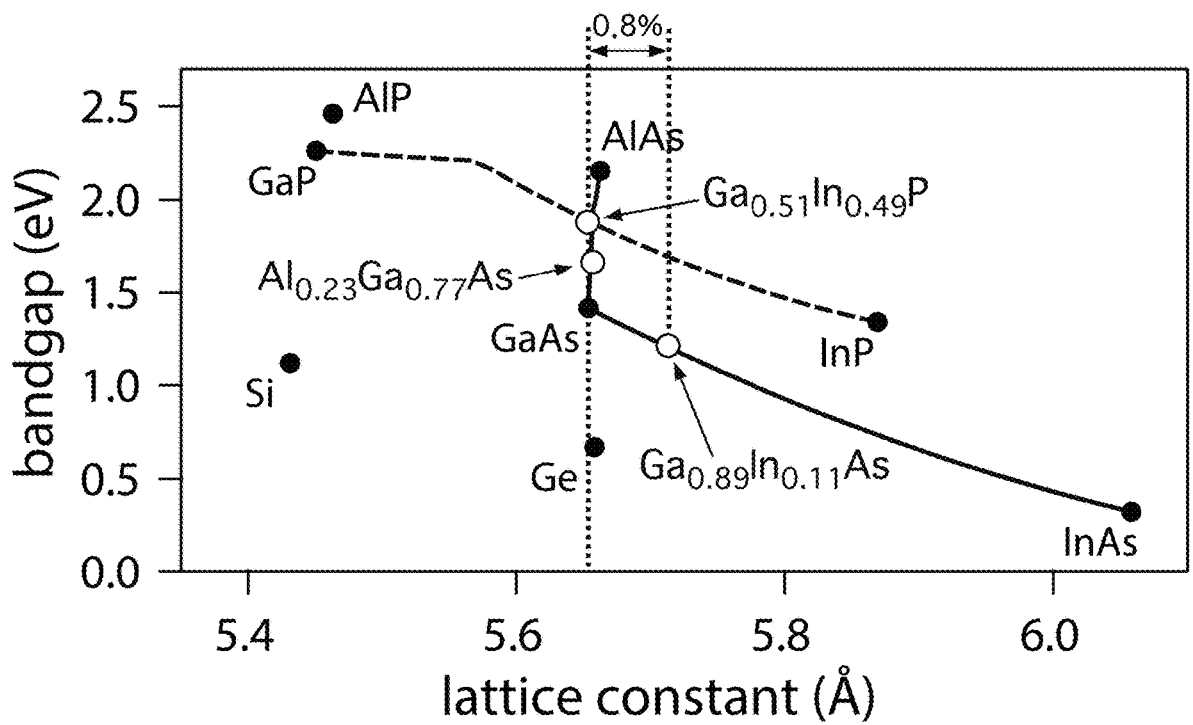
FIG. 3 illustrates a plot of bandgaps vs. lattice constants for various III-V alloys for some PEC devices, according to embodiments of the present disclosure.

As described herein, the relationship between bandgap and lattice constant (α) for cells constructed from various III-V alloys GaInP, GaInAs, and AlGaAs was evaluated (see FIG. 3). GaP and InP can be alloyed to produce a 1.8 eV bandgap, and GaAs and AlAs can be alloyed to produce a 1.7 eV bandgap, both still lattice-matched to a GaAs substrate (α=5.653 Å). GaAs and InAs can be alloyed to produce a 1.2 eV bandgap, but with a larger lattice constant, α=5.70 Å. Bandgap pairing in epitaxial tandem first electrodes such as a GaInP/GaAs-containing electrodes for PEC devices may be limited by the need to lattice-match the cells to each other in order to achieve high material quality. However, metamorphic, lattice-mismatched epitaxy using a compositionally graded buffer (CGB) layer to gradually change the lattice constant, enabled the use of bandgap combinations that were not constrained by the lattice constant of the substrate. Controlling the growth conditions helped confine misfit dislocations to the inactive CGB layer and minimized the amount of dislocation defects that penetrated the photoactive layers (e.g. the first cell and the second cell of a tandem first electrode). However, a CGB layer employed between the substrate and the second cell may result in susceptibility of both active layers to dislocation defects. Thus, although freed from the lattice matching constraint to the substrate, such a design may require that the two cells be lattice-matched to each other such that their bandgaps may not be varied independently. Note that the dashed vertical line passing through the GaAs point of FIG. 3 illustrates compositions that are lattice-matched to GaAs.

Figure 8:
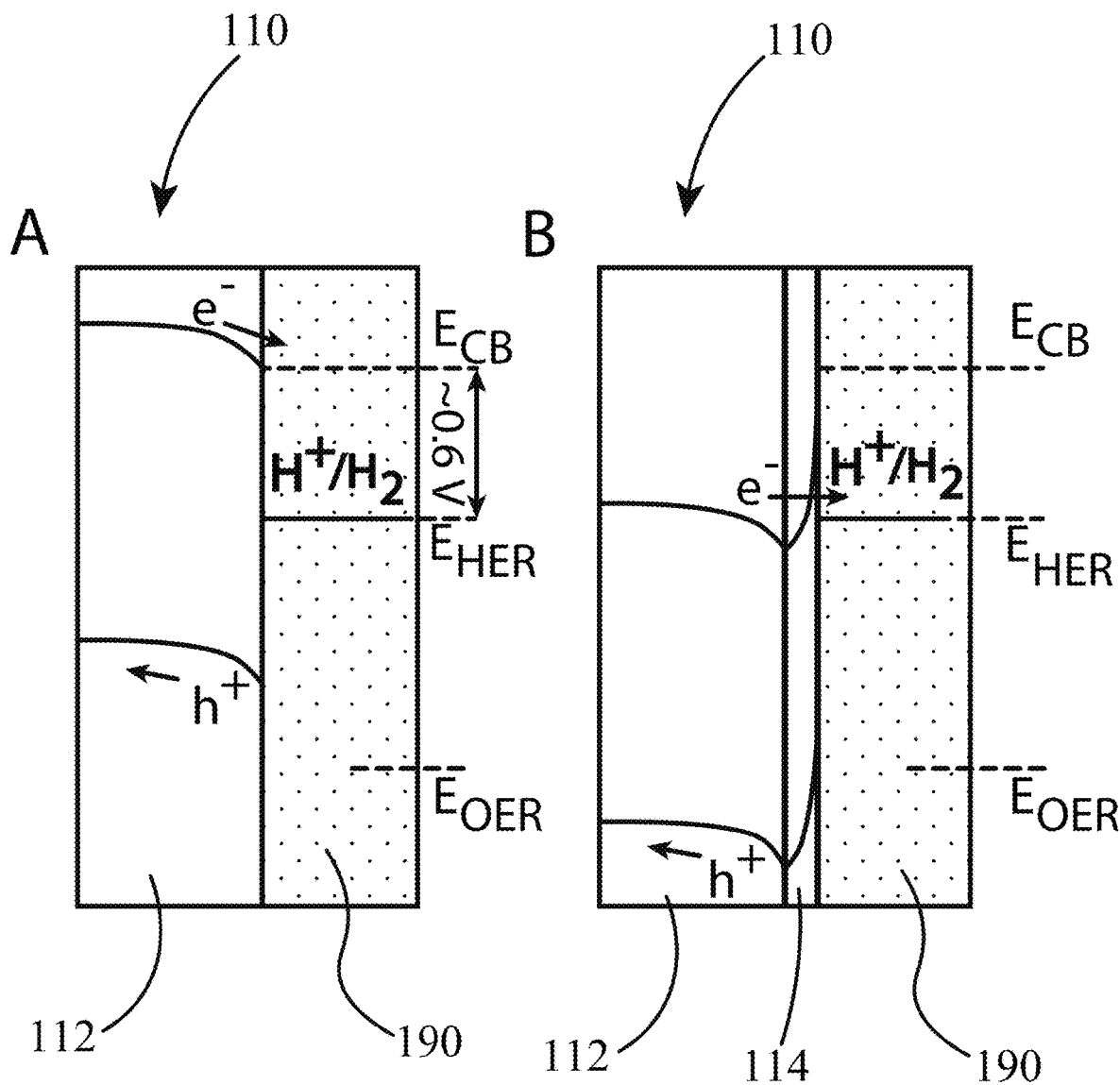
FIG. 8 illustrates the band alignment and bending (Panel A) of p-GaInP and (Panel B) n/p-GaInP, according to some embodiments of the present disclosure.

As demonstrated herein, $\eta_{STH}$ exceeded 16% when demonstrating a pathway to even higher efficiencies via III-V alloys with tunable bandgaps, enabled by "inverted" metamorphic multi junction (IMM) growth. Inverted growth avoided having a high density of dislocations in the first, higher-power cell by growing it first, before the CGB layer and the second, lower-power cell. A single CGB layer 130 between the first cell 110 and the second cell 120 allowed their bandgaps to be independently varied, utilizing a CGB layer 130 that was transparent to wavelengths transmitted to the second cell 120 (see FIG. 4). The bandgap ($E_g$) values for the first cell 100 and second cell 120 were 1.8 eV and 1.2 eV, respectively, in this example. Referring to FIG. 4, $E_{CB}$, $E_F$, and $E_{VB}$ describe the energies of the conduction band, Fermi level, and valence band, respectively, for the second cell 120 at the contact with the back reflector 175, which also serves as an Ohmic contact to collect holes in this configuration. $V_{ph1}$ and $V_{ph2}$ are the photovoltages generated by the first cell 110 and second cell 120, respectively. The term hv stands for photon energies and is a combination of Planck's constant (h) and (photon) frequency (ν or the greek character "nu") and is used here to describe the range of photon energies absorbed by each cell. Since 1.8 eV corresponds to a photon with a wavelength (λ) of 689 nm, the arrows could also be labeled "λ<689 nm" to identify the photon range that the first cell 110 absorbs and "λ>689 nm" to identify the range of photons that pass through to the second cell 120. Thus, in this example, the second cell 120 can only absorb photons with energies above its 1.2 eV bandgap and those that are not filtered by the first cell 110, or stated another way, can only utilize photons with 1022 nm>λ>689 nm. The "$\eta_c$" is showing the cathode overpotential, "$\eta_a$" the anode overpotential, and taken together, are meant to represent that although the thermodynamic requirement for water electrolysis (at 25° C.) is 1.23 V, additional potential or "overpotential" is needed to make the half-reactions proceed at a reasonable rate. Electrons are depicted as e⁻ and holes as h⁺, while H⁺ describes a proton in solution. The y-axis label ($dN_{ph}d\lambda$) on the rotated graph on the right of FIG. 8 is a mathematical expression of photon flux (in the AM 1.5 G reference spectrum) at each wavelength.

In some embodiments of the present disclosure, first electrodes were grown in an inverted fashion with the eventual illuminated side, the first cell, grown first followed by the buffer layer (e.g. either a single layer or two or more compositionally graded layers), followed by growth of the second cell. Substrate removal during post-growth processing allowed the first electrode to be re-oriented. Inverted growth has a distinct advantage over "upright" growth. Because the first cell generates a higher voltage than the second cell—and therefore, a larger fraction of the total power—good material quality in the first cell helps provide a higher overall efficiency in the final PEC device (e.g. where the PEC device includes both a photocathode (the first electrode), electrolyte, and an anode, (the second electrode). Such an inverted growth architecture allows the lattice-matched first cell to be grown with very few defects and excellent material quality. Deleterious effects, if any, from the dislocations that result from the lattice mismatch may be largely confined to the lower-power-producing second cell.

In an example of a first electrode for a PEC device, after epitaxial growth of the first cell, the buffer layer, and the second layer were completed, a 1-μm-thick gold film, e.g. back reflector, was deposited on the second cell of the first electrode to act as both a rear ohmic/electrical contact and a photon reflector. In the latter capacity, the gold back reflector allowed the second cell to be thinned by about a factor of two while maintaining the same effective absorption volume, thus providing a reduction in cost. If the second cell quality is high enough, the back reflector may also enhance photon recycling, resulting in a voltage increase. The first electrode was then bonded using epoxy adhesive to a flat, rigid silicon wafer handle to provide mechanical support and the GaAs substrate was removed, leaving the wide-bandgap first cell as the uppermost, light-receiving layer. Here, the substrate was removed by selective chemical etching, however, any suitable technique may be used such as spalling and/or epitaxial lift-off, to allow reuse of the GaAs substrate, which can be up to 100× thicker than the first electrode and the largest cost driver for III-V epitaxy. In some embodiments, final processing steps included 1) deposition of a PtRu catalyst layer via flash sputtering for very low co-catalyst loading (~500 ng/cm²), which can be a viable option for terawatt-scale PEC applications, and 2) encapsulation by an insulating encapsulating layer around the first electrode perimeter, which allowed the exposed PtRu-modified first cell (or catalyst-modified capping layer, as described below) surface to contact the electrolyte (for example, 3 M sulfuric acid with 1 mM Triton X-100) without shorting the sides of the first electrode or the back reflector. Growth specifications and a processing flow diagram are provided in below (see FIG. 19).

In benchmarking $\eta_{STH}$, protocols were used that expand on previous work (H. Döscher, J. L. Young, J. F. Geisz, J. A. Turner, T. G. Deutsch, *Energy Environ. Sci.* 9, 74-80 (2015), which is incorporated be reference herein in its entirety) in identifying and mitigating critical influence factors that introduce measurement error. The advanced benchmarking protocols include:

1) On-sun, direct-only (diffuse excluded) solar illumination as necessary for accurate and precisely defined illumination (see below), that also mitigates optical concentration effects inherent to diverging-source solar simulators (see below),
2) Incident photon-to-current efficiency (IPCE) measurements for spectral correction, translation of performance measurements to other reference conditions such as AM1.5G, and $\eta_{STH}$ validation including active-area definition, and
3) Confirmation of Faradaic efficiency (see below).

Figure 5:
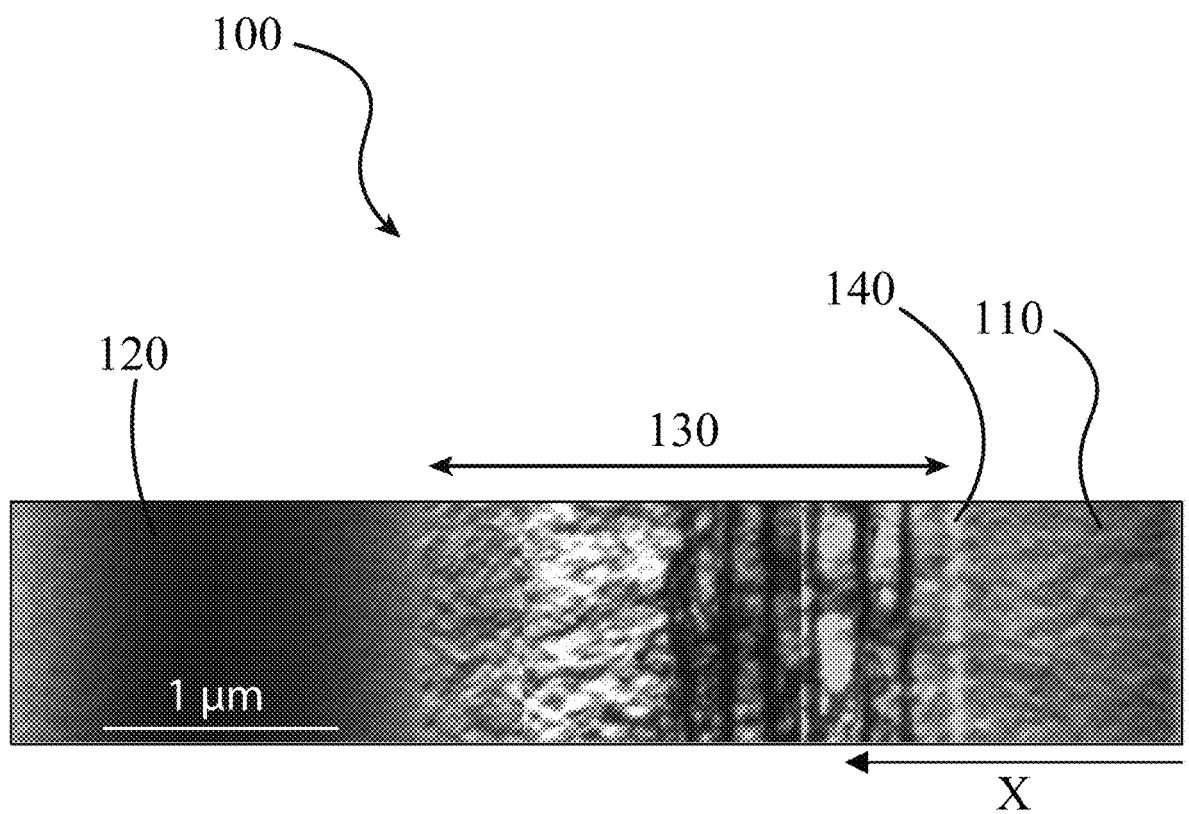
FIG. 5 illustrates a transmission electron microscopy (TEM) cross-section of an IMM device highlighting the transparent, compositionally graded buffer (CGB) layer and the transparent tunnel junction, according to some embodiments of the present disclosure.

Referring again to FIG. 4, a schematic of the 1.8/1.2 eV GaInP/GaInAs (first cell 110/second cell 120) for a first electrode 100 of a PEC device 400 is illustrated. The device 400 includes a first electrode 100 (e.g. the photocathode) and a second electrode 405 (the anode), electrically connected by a circuit 430. An electrolyte 190 is positioned between the first electrode 100 and the second electrode 405. Light (430A and 430B) pass through the electrolyte 190 to strike the outer most surface of the first electrode 100 (e.g. the capping layer (not shown) having the catalyst (not shown) on its surface) The first electrode 100 in FIG. 4 is shown to include a buffer layer 130 and a tunnel junction 140 positioned between the first cell 110 and a second cell 120, with the tunnel junction 140 positioned between the buffer layer 130 and the first cell 110. In addition, the first electrode 100 also contains a back reflector 175 attached to the second cell 120 and a handle 180 attached to the back reflector 175 by an intervening adhesive 170. The incident solar flux (e.g. the light) was split between a first wavelength range of light 430A being at least partially absorbed by a GaInP first cell 110 and a second wavelength range of light 430B by a GaInAs second cell 120 that were series connected via the transparent tunnel junction 140. At the first electrode 100 semiconductor/electrolyte interface (e.g. the interface between at least one of the first cell 110, the passivating layer (not shown), the capping layer (not shown), and/or the catalyst layer (not shown) with the electrolyte 190), conduction-band electrons ($e^-$) reduced protons ($H^+$) to evolve hydrogen gas ($H_2$) while water was oxidized at the second electrode 405 (e.g. a metal anode), producing oxygen ($O_2$) and protons ($H^+$). The transparent, AlGaInP-based CGB (buffer) layer 130 is indicated in a transmission electron microscopy (TEM) cross-section shown in FIG. 5, which also illustrates the relationship of the first cell 110, the second cell 120, and the tunnel junction 140. The arrow labeled X in FIG. 5 indicates the direction of growth for the various layers shown in the example of a first electrode 100 (e.g. inverted growth). Dislocations necessary to change the lattice constant are visible throughout the transparent CGB layer 130, but its design and engineering largely confined and prevented dislocations from penetrating into the second cell 120. The lack of visible dislocations in the GaInAs second cell 120, in conjunction with cathodoluminescence measurements (not shown), indicates a dislocation density less than $10^6$ $cm^{-2}$, which limits non-radiative recombination and thus voltage loss. With a total first electrode 100 thickness of only ~5 μm, constituent material consumption were minimized.

In the following, some embodiments of first electrode structures of the present disclosure, IPCE, and on-sun current density-voltage (J-V) measurements of six monolithic, III-V tandem water-splitting devices are discussed; refer to FIG. 1 for a reference to the various elements of the first electrode (see FIGS. 6 and 7; in FIG. 6 the jagged solid line refers to AM 1.5G and the thick solid line to the PEC reflection limit):

Baseline) LM (lattice matched)-upright: A baseline PEC device included a lattice-matched, GaInP/GaAs (first cell 110/second cell 120) tandem first electrode 100, grown normally (e.g. not inverted) on a GaAs substrate having a 650 μm thickness.

Example 1) LM-inverted: In this first example, the lattice matched (LM) structure was produced as an inverted first electrode 100 to demonstrate the advantages of a back reflector 175 deposited after inverted growth of the first cell 110 and the second cell 110. All subsequent examples of first electrodes 100 were grown in this inverted fashion.

Example 2) IMM-p: In this example, a 1.2 eV $Ga_{0.89}In_{0.11}As$ (GaInAs) replaced the 1.4 eV GaAs second cell 120 of the Example 1.

Example 3) IMM-pn: In this example, a p-n architecture was developed for the first cell 110, to help maximize the photovoltage generated by the first cell 110 by the addition of a thin (25 nm or less), n-GaInP layer 114 adjacent to the p-GaInP 112 layer used in the Baseline and Examples 1 and 2. In addition, current matching was optimized by slightly increasing the bandgap of the second GaInAs cell 120.

Example 4) IMM-pnw: In this example, a 20-nm-thick n-AlInP passivating layer 150 and 10-nm n-GaInP capping layer 160 were added to the first electrode 100 of Example 3, where the passivating layer 150 was positioned between the n-type layer 114 of the first cell 110 and the capping layer 160.

Example 5) IMM-AlGaAs: In this example, this first electrode 100 of Example 4 was modified by replacing both the n-type and p-type layers of the (114 and 112 respectively) 1.8 eV GaInP first cell 110 with a 1.7 eV $Al_{0.23}Ga_{0.77}As$ (AlGaAs) first cell 110, also having both a p-type layer 112 and an n-type layer 114, resulting in a pn-junction. For optically thick AlGaAs, the second GaInAs cell 120 would be current-limiting, so the AlGaAs of the first cell 110 of the first electrode 100 was reduced to 650 nm to current-match the two cells (110 and 120).

Figure 6:
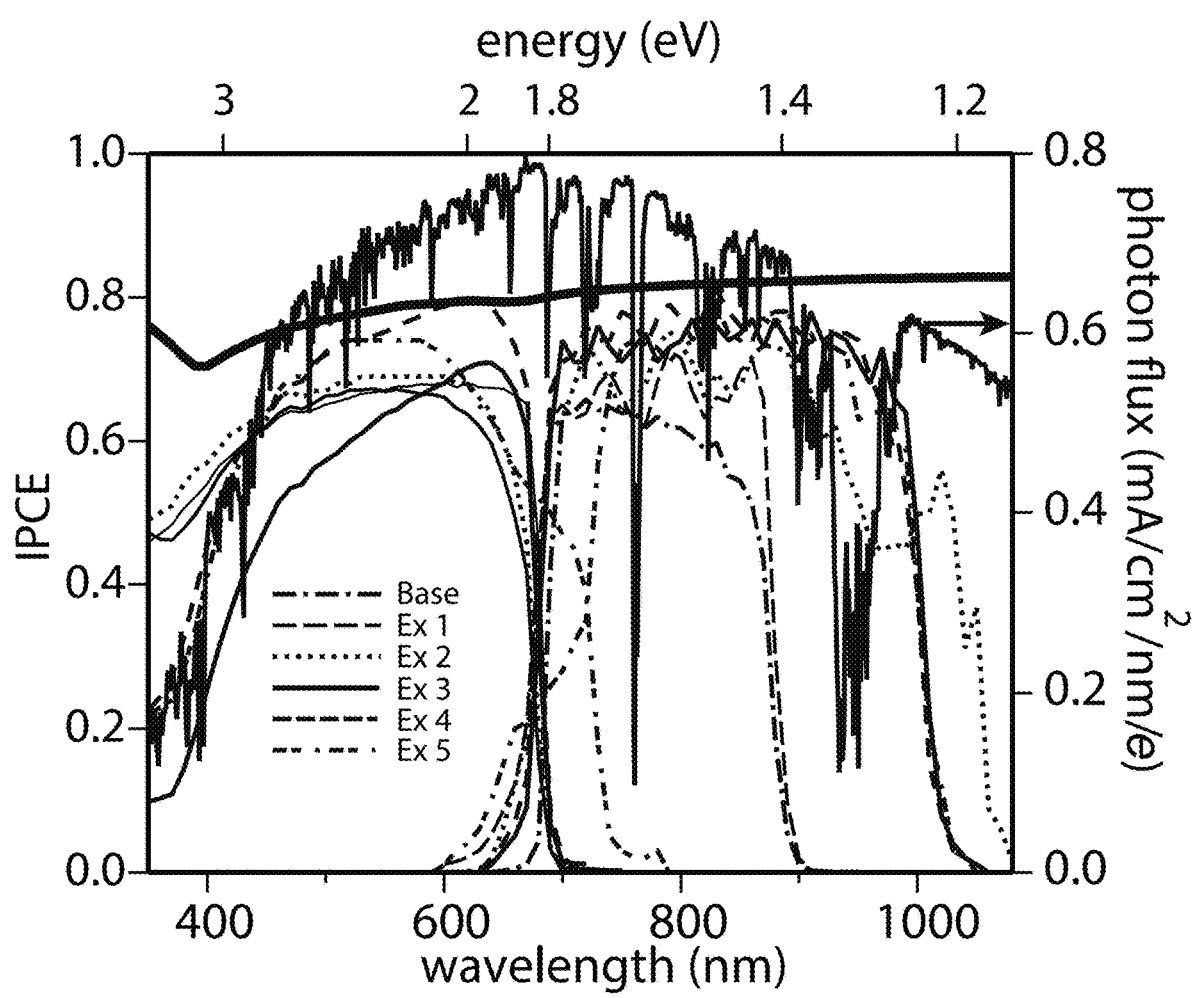
FIG. 6 illustrates the incident photon-to-current efficiency (IPCE) for various embodiments of a first electrode for PEC water-splitting, according to some embodiments of the present disclosure.

FIG. 6 illustrates the IPCE (left axis) of the six devices (e.g. the Baseline and Examples 1-5) overlaid on the AM1.5G reference spectrum (right axis). The first cell constructed of GaInP of the Baseline PEC device absorbed and converted photons with energies ≥1.8 eV to current with an IPCE=0.5-0.7. Lower energy photons were transmitted through the GaInP first cell and those having energies ≥1.4 eV were absorbed by the second cell constructed of GaAs with an IPCE=0.5-0.65. The IPCE was integrated over a reference spectrum flux to calculate the expected short-circuit photocurrent density generated by each cell ($J_{sc}^{IPCE}$). These values are recorded in Table 1 for two reference spectra: AM1.5D scaled to 1 $kW/m^2$ per convention and AM1.5G. The $J_{sc}^{IPCE}$ values in the text hereafter are for AM1.5D (1 $kW/m^2$) unless noted otherwise. The Baseline device having a GaInP first cell and a GaAs second cell have $J_{sc}^{IPCE}$=11.9 and 7.8 $mA/cm^2$ respectively, showing that the GaAs second cell was the limiting junction. On-sun, the Baseline tandem first electrode generated an actual short-circuit photocurrent density ($J_{sc}^{Sun}$) of $J_{sc}^{Sun}$=7.5 $mA/cm^2$ (see FIG. 7), demonstrating good agreement with the IPCE analysis. The GaInP thickness of the first cell may be reduced to current-match the LM-upright at ~9.9 $mA/cm^2$, but this does not increase access to more of the solar flux necessary for the higher theoretical $\eta_{STH}$ (see FIG. 2). Instead, the GaAs second cell of the Baseline device was replaced with a narrower bandgap GaInAs alloy(s) to extend the second cell's spectral response.

Figure 7:
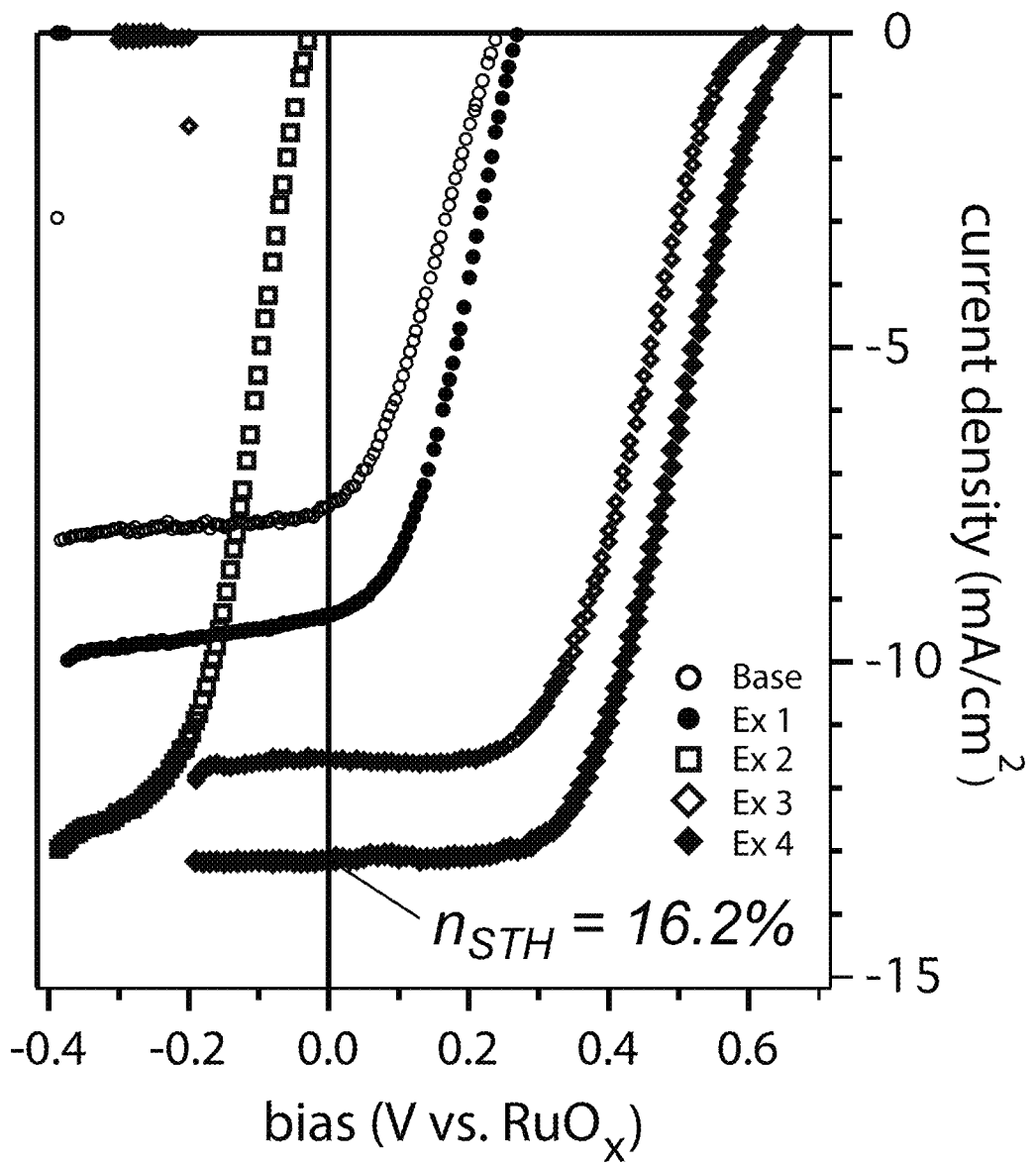
FIG. 7 illustrates J-V characterization for various embodiments of a first electrode for PEC water-splitting, according to some embodiments of the present disclosure.

A direct comparison of the Baseline device utilizing a tandem GaInP/GaAs first electrode and the similar device constructed in an inverted fashion (Example 1) is shown in FIGS. 6 and 7. The Baseline device lost a portion of the near-band-edge photons to the GaAs substrate, shown by the decline in IPCE toward the band-edge energy of GaAs (1.4 eV). In contrast, with the back reflector, the near-band-edge photons were reflected back into the device of Example 1, boosting long-wavelength response and generating interference oscillations apparent in its IPCE. Correspondingly, photocurrent density of the device of Example 1 increased to $J_{sc}^{Sun}$=9.2 $mA/cm^2$, a 1.7-$mA/cm^2$ improvement over the LM-upright device.

TABLE 1

Efficiency benchmarking figures of merit

| | | | | | Broadband, On-Sun | | | | Integrated IPCE photocurrent | | | |
| | | | | | AM1.5D (1 kW/m²) | | AM1.5G | | AM1.5D (1 kW/m²) | | AM1.5G | |
| Device indentifier | Growth | Top absorber | Bottom absorber | Top junction | $J_{sc}$ (mA/cm²) | $\eta_{STH}$ | $J_{sc}$ (mA/cm²) | $\eta_{STH}$ | Top (mA/cm²) | Bottom (mA/cm²) | Top (mA/cm²) | Bottom (mA/cm²) |
|---|---|---|---|---|---|---|---|---|---|---|---|---|
| Baseline | upright | LM GaInP | LM GaAs | PEC | 7.5* | 9.2 | 7.6 | 9.3 | 11.9 | 7.8 | 12.2 | 7.8 |
| Example 1 | inverted | LM GaInP | LM GaAs | PEC | 9.2 | 11.3 | 9.3** | 11.4 | 11.2 | 9.6 | 11.4 | 9.6 |
| Example 2 | IMM | LM GaInP | LMM InGaAs | PEC | 0 | 0 | 0 | 0 | 11.7 | 14.7 | 12.0 | 14.4 |
| Example 3 | IMM | LM GaInP | LMM InGaAs | p-n | 10.9 | 13.4 | 11.5 | 14.1 | 10.8 | 14.6 | 10.9 | 14.2 |
| Example 4 | IMM | LM GaInP | LMM InGaAs | p-n + passivation | 12.5 | 15.4 | 13.2 | 16.2 | 13.0 | 14.8 | 13.2 | 14.5 |
| Example 5 | IMM | LM AlGaAs | LMM InGaAs | p-n + passivation | 12.9 | n/a# | 13.6 | n/a# | 13.6 | 13.5 | 13.8 | 13.2 |

Abbreviations:
LM = Lattice matched,
LMM = Lattice mismatched,
IMM = Inverted metamorphic multijunction
*Value from Döscher et al.
**$I_{sc}$ measured under solar simulated illumination
$\eta_{STH}$ not available because hilted stability precluded Faradaic efficiency verification The bandgap pairing of the GaInP/GaInAs (first cell/second cell) in the first electrode in the PEC device of Example 2 enabled a higher theoretical $\eta_{STH}$ than the Baseline and Example 1 devices. The device of Example 2 included a 1.2 eV bandgap GaInAs second cell, extending the second cell's spectral response considerably to $J_{sc}^{IPCE}$=14.8 mA/cm². Although the GaInP first cell's current density of $J_{sc}^{IPCE}$=11.7 mA/cm² limited the tandem photocurrent density generated by the first electrode, the device of Example 2 provided a 2.1-mA/cm² improvement over the device of Example 1. However, the photocurrent-for-photovoltage tradeoff resulting from the lowering of the second cell's bandgap resulted in insufficient photovoltage to drive water-splitting (i.e. $J_{sc}^{Sun}$=0). This highlights the importance of understanding the design criteria for maximum water-splitting efficiency: Photocurrent density (and thus $\eta_{STH}$) may be maximized with lower-bandgap energy pairings while maintaining sufficient photovoltage for water-splitting.

To improve the photovoltage generated by the first electrode of a PEC device, the band-edge energetic alignment at the GaInP first cell of the first electrode was evaluated. The GaInP conduction band alignment is about 0.6 V above the hydrogen-evolution reaction (HER) potential. For a GaInP-containing photocathode (e.g. first electrode), the corresponding offset in the valence band and bulk Fermi level means holes reaching the electrolyte via the anode have insufficient oxidative potential for the oxygen-evolution reaction (OER). Because only ~50 mV overpotential is necessary to drive the HER at high rates, conduction-band electrons in the GaInP first cell of the Baseline or Example 1 devices reached the electrolyte with 0.55 V excess overpotential. This excess is a photovoltage loss unless the band alignment can be shifted to more positive potentials, toward the OER (see below). Next, it is demonstrated herein that significantly enhanced and tunable photovoltage may be obtained using a p-n homojunction in the first cell of a photocathode for water-splitting.

In Example 3, the IMM device utilized a p-n homojunction (IMM-pn) in the first cell, resulting in an optimized photovoltage that was ~0.55 V higher than the device of Example 2. Samples with three different thicknesses and doping densities of an n-type GaInP layer in the first cell were fabricated, characterized, and evaluated experimentally and with band-bending calculations (see below). The n-type layer of the GaInP first cell in the first electrode of the device of Example 3 produced upward band bending toward the electrolyte that lowered the conduction band systematically with thickness and doping density, allowing the excess overpotential to be reduced. Thus, the device of Example 3 produced $J_{sc}^{Sun}$=10.9 mA/cm², and, in good agreement, a $J_{sc}^{IPCE}$=10.8 mA/cm² was measured for the limiting first cell. Uniformly doped p-type GaInP cells (e.g. Example 1) have $J_{sc}^{IPCE}$=11.7 mA/cm², while the device of Example 3 has a lower $J_{sc}^{IPCE}$ because of lower response at short wavelengths, presumably also due to upward band bending in the n-GaInP layer of the first cell that blocks transport of holes generated within the n-GaInP layer (see FIG. 8). EHER in FIG. 8 is the electrochemical potential at which protons are reduced to hydrogen and is a function on proton concentration, so it varies from the proton reduction potential at standard state according to the Nernst equation. The EOER is the potential of water oxidation, is also a function of proton concentration in the electrolyte, but is always 1.23 V positive (below) EHER. ECB in FIG. 8 depicts the potential at which the conduction band is pinned at the interface with the electrolyte, which dictates the potential where electrons are injected into the electrolyte. ECB of 110 is also a function of the proton concentration in the electrolyte in the absence of 114, however, ECB, EHER, and EOER all move together so that their relative positions remain constant. Still, it is notable that the 0.55 V photovoltage enhancement resulted from adding an n-type layer to the first cell of the first electrode that was only 25 nm thick. The device of Example 3 not only overcame the photocurrent-for-voltage tradeoff of a lower second cell bandgap, but also provided excess photovoltage that allowed further lowering of the first cell and/or second cell bandgaps for even higher efficiencies.

Before further lowering the bandgap of either the first cell and/or the second cell of the first electrode of a PEC device, the use of a passivating layer for recovering short-wavelength response sacrificed in the first cell was explored. Thus, an approximately 15 nm thick n-AlInP passivating layer was added on top of the IMM-pn first cell of the device of Example 3, resulting in the IMM-pnw structure of Example 4. The n-type AlInP passivating layer had a relatively wide, indirect bandgap and was highly transparent, with its conduction band aligned to that of GaInP (e.g. the first cell) to ensure facile electron transport to the electrolyte. The deep valence band of the passivating layer provided passivation by blocking minority-carrier holes from surface recombination sites while also counter-acting the upward band bending of the n-type layer of the GaInP first cell that can occur when in contact with electrolyte. Because aluminum-containing semiconductors such as n-AlInP are unstable in contact with aqueous electrolyte, an approximately 10 nm thick n-type GaInP capping layer was also included in the device of Example 4 to protect the underlying n-AlInP passivating layer from corrosion during operation in aggressive PEC electrolyte. Although some parasitic absorption by the n-GaInP capping layer may have occurred, a considerable net improvement of 2.2 mA/cm$^2$ over the IMM-pn device of Example 3 resulted, with the IMM-pnw reaching $J_{sc}^{IPCE}$=13.0 mA/cm$^2$ and $J_{sc}^{Sun}$=12.5 mA/cm$^2$, which corresponds to $\eta_{STH}$=15.4% for AM1.5D (1 kW/m$^2$) and $\eta_{STH}$=16.2% for AM1.5G (average of four samples having $\eta_{STH}$=16.0%-16.4%). With surface passivation, the exceptional material quality became evident in the IMM-pnw IPCE device of Example 4 at 600 nm and 850 nm, approaching the PEC reflection limit (see FIG. 6), which is equivalent to near-unity internal quantum efficiency. The passivation also provided an additional 0.05 V photovoltage gain to give the IMM-pnw device of Example 4 ~200 mV more photovoltage than necessary, which can be traded for even higher photocurrent and $\eta_{STH}$ by using lower bandgaps.

Figure 9:
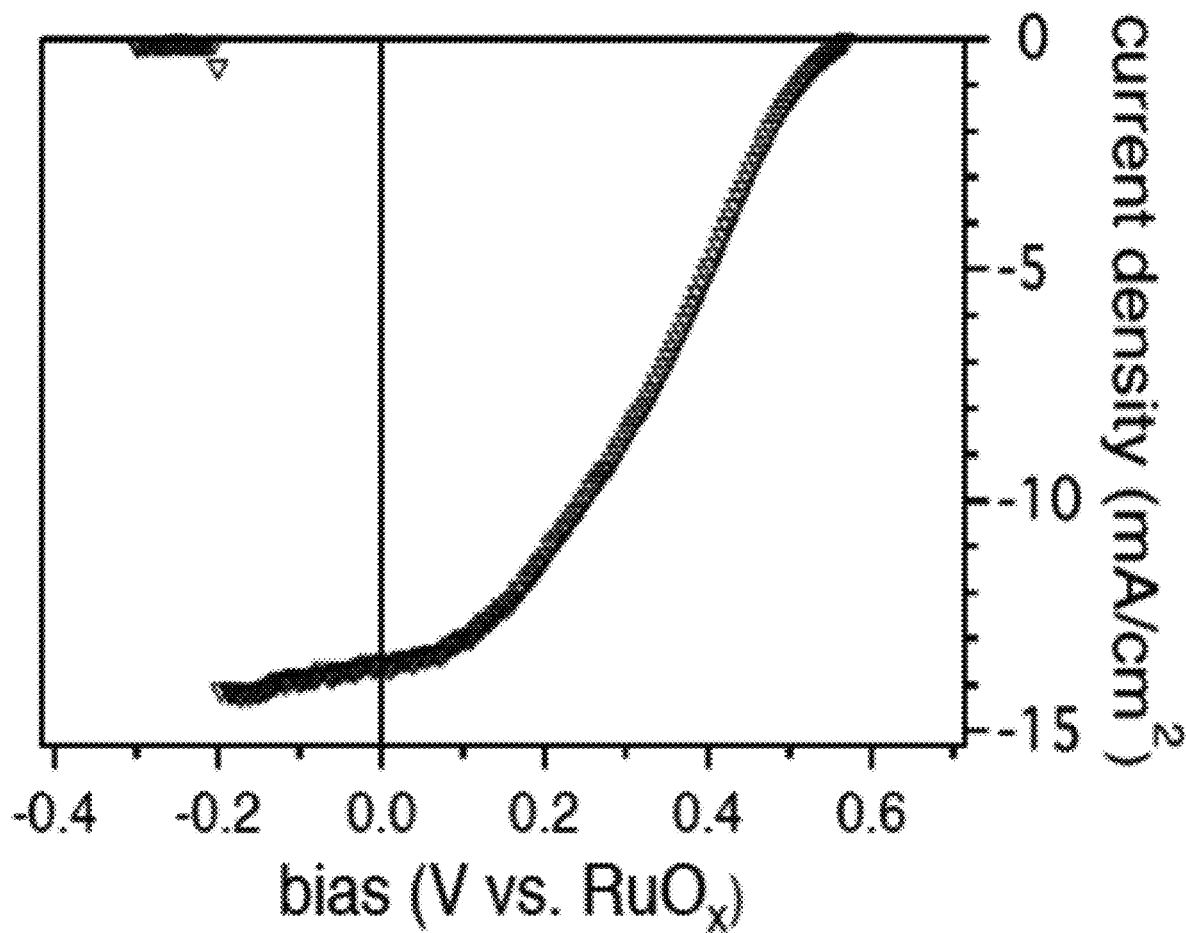
FIG. 9 illustrates the on sun J-V performance of an IMM-AlGaAs device (Example 5 of Table 1), according to some embodiments of the present disclosure.

In the IMM-AlGaAs device of Example 5, further IMM design flexibility was demonstrated by using a 1.7 eV AlGaAs first cell instead of the 1.8 eV GaInP first cell of Example 4. While the use of a GaInP first cell (e.g. Examples 2-4) represented a horizontal move in FIG. 2 toward the global maximum $\eta_{STH}$, the device of Example 5 represents a vertical move if FIG. 2 and employs the optimum first cell bandgap of 1.7 eV. The 1.7 eV bandgap of the AlGaAs first cell extended the spectral response of the previously current-limiting first cell of Example 4 to ~730 nm (see FIG. 6). For Example 5, the second cell would be current limiting for a first cell constructed of optically thick AlGaAs, so the AlGaAs first cell was reduced to a thickness of ~650 nm, which allowed a portion of the 600-730-nm photons to pass through to the underlying GaInAs second cell (note that the $\eta_{STH}$ predictions of FIG. 2 assume optically thick absorbers). As a result, the two cells were nearly current matched with AlGaAs first cell producing $J_{sc}^{IPCE}$=13.6 mA/cm$^2$ and GaInAs second cell producing $J_{sc}^{IPCE}$=13.5 mA/cm$^2$ and the PEC device generating $J_{sc}^{Sun}$=12.9 mA/cm$^2$ (see FIG. 9), which translated to an $\eta_{STH}$=16.7% (AM1.5G).

Figure 10:
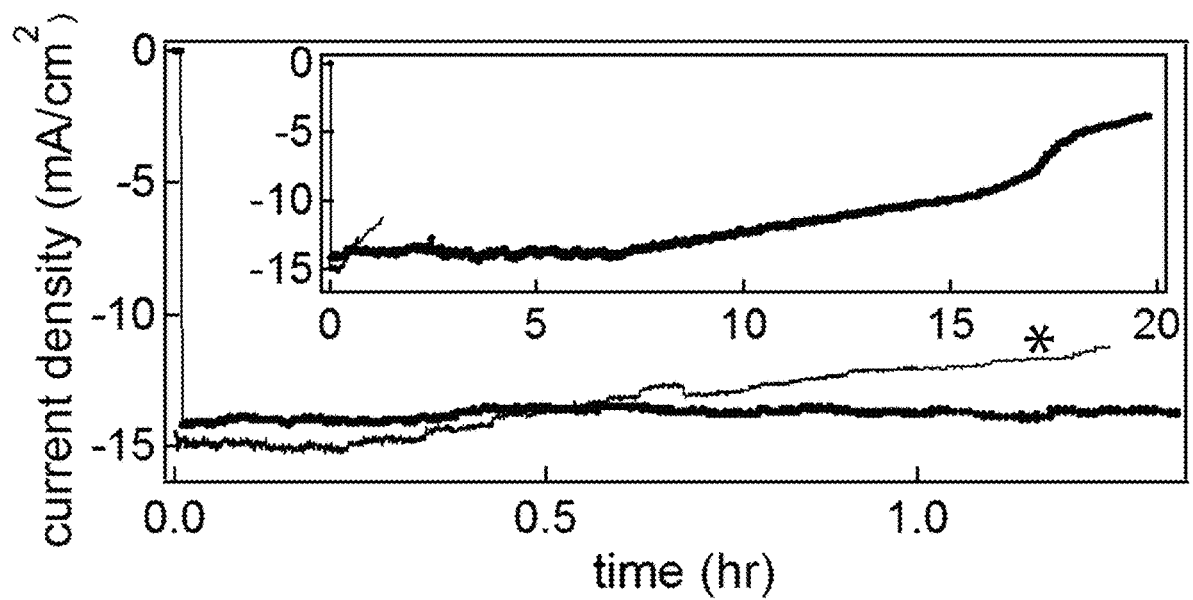
FIG. 10 illustrates durability testing results of the IMM-pnw device of Example 4, according to some embodiments of the present disclosure.

Finally, stability testing was performed and Faradaic efficiency confirmed for PEC devices using first electrodes according to some embodiments of the present disclosure. Common methodology employs three-electrode, constant-potential testing, but such conditions do not correspond to, nor are they relevant for probing durability during unassisted water-splitting. Good stability was measured under three-electrode, constant-potential testing (see FIG. 10), but the excess applied bias masked the real durability because it improved charge separation and thus cathodic protection while mitigating photoanodic corrosion mechanisms. As described herein, durability under two-electrode, short-circuit testing was performed; the conditions under which spontaneous, unassisted water-splitting occurs. The IMM-pnw device of Example 4 short-circuit photocurrent was stable for 20 minutes, then started to slowly decrease, retaining 85% of the initial photocurrent after one hour (see FIG. 10). Collection and quantification of evolved hydrogen and oxygen during this durability test gave Faradaic efficiencies of 0.99 for hydrogen and 0.96 for oxygen. The same values were obtained using Pt electrodes, thus confirming Faradaic efficiencies of unity within the precision of the measurement (see below). (Referring to FIG. 10, the data set marked with an asterisk corresponds to a data set measure using two-electrode, short-circuit testing; the remaining two data sets correspond to three-electrode testing at 0.6V versus the reversible hydrogen potential (RHE).

In conclusion, IMMs with a transparent CGB between the junctions provided a flexible platform for realizing tandem bandgap combinations in the photocathodes (e.g. first electrodes) capable of achieving maximum STH efficiency in PEC devices using such photocathodes. Processing and performance advantages of inverted growth of photocathodes over upright growth of photocathodes and superior material quality were observed, with internal quantum efficiencies approaching unity. Starting with a lattice-matched GaInP/GaAs (first cell/second cell) PEC/PV tandem first electrode, the bandgap of the second cell was independently varied from 1.4 eV for GaAs to 1.2 eV for InGaAs and a p-n doping profile was employed that enhanced the photovoltage by 0.55 V to demonstrate $\eta_{STH}$=~14.1% for the IMM-pn device of Example 3. The response of the current-limiting GaInP first cell was then improved by adding a passivating layer and a capping layer to achieve $\eta_{STH}$=16.2% with the IMM-pnw device of Example 4. Further, in the IMM-AlGaAs device of Example 5, the bandgap of the first cell was independently lowered from 1.8 eV for an GaInP alloy to 1.7 eV for an AlGaAs alloy while retaining the 1.2 eV bandgap of the InGaAs second cell. The IMM-AlGaAs device of Example 5 showed a capacity for $\eta_{STH}$=16.7%. For a given bandgap combination, the difference between the demonstrated and predicted $\eta_{STH}$ (see FIG. 2) was largely due to reflection at the electrolyte/semiconductor interface, which limits the IPCE to 0.8.

Methods:

Calculation of capture area for one metric ton of H$_2$/day: Herein is calculated the solar capture area necessary to produce 1 metric ton of hydrogen per day, which is equivalent to 5, 4, and 3 football fields for $\eta_{STH}$=15%, 20%, and 25%, respectively. A 25% solar capacity factor, reasonable for a 2-D tracking system in the Southwest U.S., and 98% plant operating capacity factor are assumed. At hydrogen production rates of 1.702×10$^{-6}$ kg/m$^2$·s for an $\eta_{STH}$=20% device, 20400 m$^2$ of capture area, the area of about four regulation size National Football League fields (each 110 m×49 m) are required for 1 tonne H$_2$/day: $\eta_{STH}$=25% is 16,320 m$^2$; $\eta_{STH}$=15% is 27,199 m$^2$. It is assumed that typical fuel cell vehicles have a 5 kg H$_2$ tank capacity and ~70 miles/kg H$_2$ range, such that 1 metric ton of H$_2$ fills 200 vehicles having 350 mile range each.

On-sun benchmarking protocol: It has been shown that accurate on-sun benchmarking measurements require exclusion of diffuse radiation that is readily coupled into PEC cells and inflates photocurrent measurements. To this end, procedures have been established herein for using the direct solar radiation only, which being nearly collimated, also mitigates error from refraction at and optical concentration by the PEC cell interfaces (as shown below). Here, the on-sun benchmarking protocol is expanded to include translation of device performance to reference conditions such as AM1.5D (1 kW/m$^2$) and AM1.5G.

On-sun benchmarking measurements were performed at the Solar Radiation Research Laboratory (SRRL, www.nrel.gov/midc/srrl_bms) at the National Renewable Energy Laboratory (NREL), in Golden, Colo. At this location, direct solar irradiance is measured every minute by a Kipp & Zonen pyroheliometer and spectral data is measured ever five minutes by a NIST traceable Prede PGS-100 Direct Normal Spectroradiometer. Matching that of the pyroheliometer, a 5° field-of-view collimating tube was constructed following ASTM E1125-99, through which each device being benchmarked was illuminated. Shadow alignment marks ensure a collimating tube pointing accuracy better than 1°. With clear skies (broadband turbidity ~0.2 or lower), the spectral mismatch between the solar illumination provided by this configuration and AM1.5D is 1% or less between ~9 am and ~11 am. Regardless, the minor spectral correction was performed using IPCE and real-time spectral data following established procedures.

The spectral correction procedures are based on those used for a primary reference cell (RC) calibration, where the short-circuit photocurrent of a reference cell, measured outdoors, is translated to reference illumination (for example AM1.5D or AM1.5G). Here, the device to be benchmarked takes the place of the reference cell. The measured photocurrent $I_{sc}^{meas}$ is translated to reference conditions at 1000 W/m² following $$I_{sc}^0 = I_{sc}^{meas} \frac{1000 \text{ W} m^{-2}}{E_{meas}} \times CN,$$

where $I_{sc}^0$ is the desired photocurrent, $E_{meas}$ is the total measured irradiance in W/m², and CN is the so-called calibration number, given by $$CN = \frac{\int_{300}^{4000} E_{REF}(\lambda) SR^{RC}(\lambda) d\lambda \cdot \int_{300}^{4000} E_{INC}(\lambda) d\lambda}{\int_{300}^{4000} E_{REF}(\lambda) d\lambda \cdot \int_{300}^{4000} E_{INC}(\lambda) SR^{RC}(\lambda) d\lambda}.$$

The CN accounts for the spectral mismatch between the measured outdoor spectral flux $E_{INC}(\lambda)$, the reference spectral flux $E_{REF}(\lambda)$, and the IPCE or spectral response of the device, $SR^{RC}(\lambda)$, and as noted above is on the order of ~1% for our measurements. The integration is taken over the wavelengths 300-4000 nm of the full solar spectrum. In principal, $E_{meas} = \int_{300}^{4000} E_{INC}(\lambda) d\lambda$, but different subscripts are used herein to distinguish between the two quantities, since in practice they are measured on separate instruments, each with its own accuracy.

For tandem first electrodes of a PEC device, $I_{sc}^0$ is first calculated for each junction individually using its subcell $SR^{RC}(\lambda)$, assuming that it is the current limiting junction. The quoted $I_{sc}^0$ for the tandem device is then taken as the lower value between the values of the first cell and the second cell.

Figure 11:
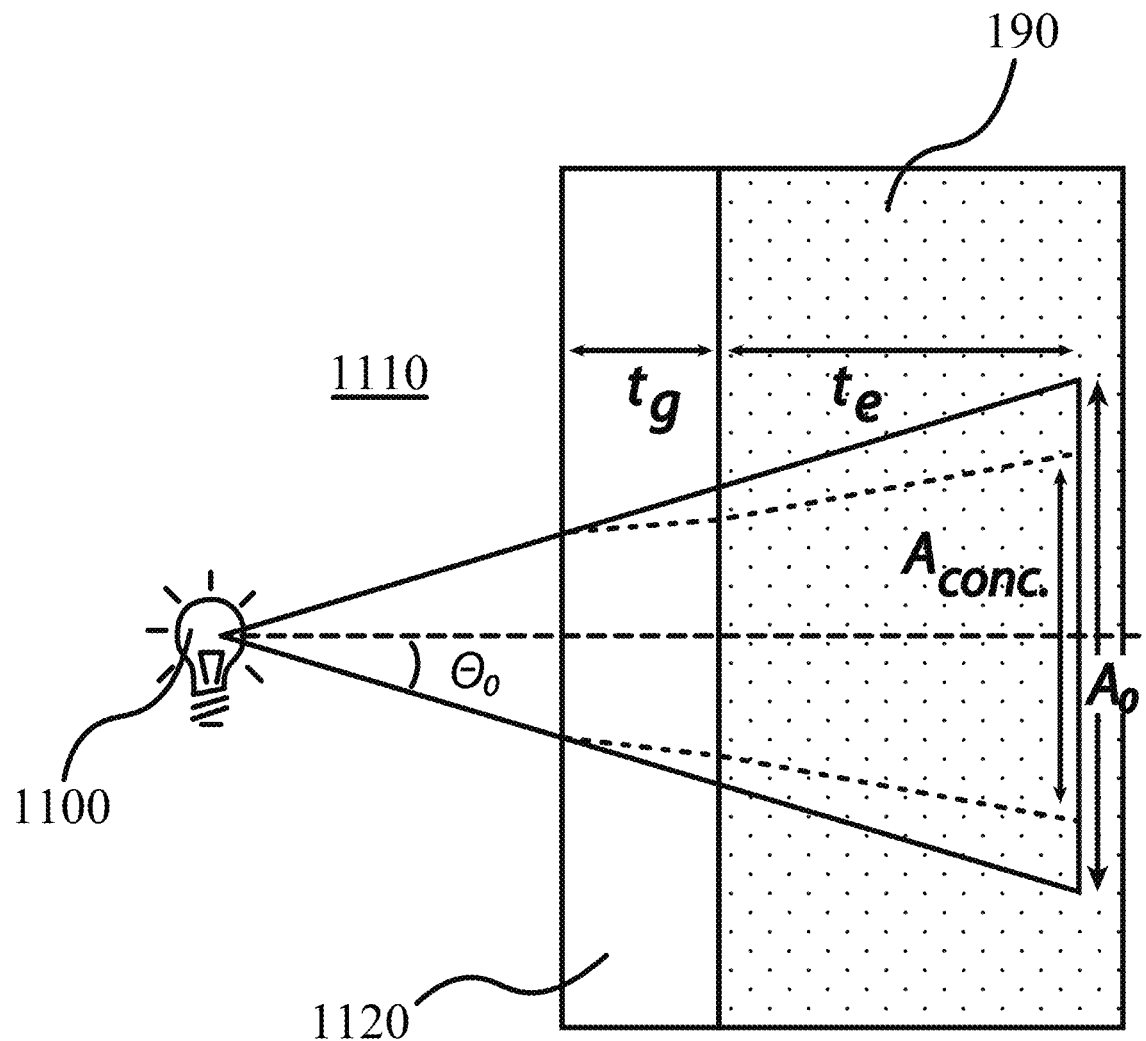
FIG. 11 illustrates the refraction geometry of a PEC cell caused by optical concentration from the PEC cell interfaces, according to some embodiments of the present disclosure.
Figure 12:
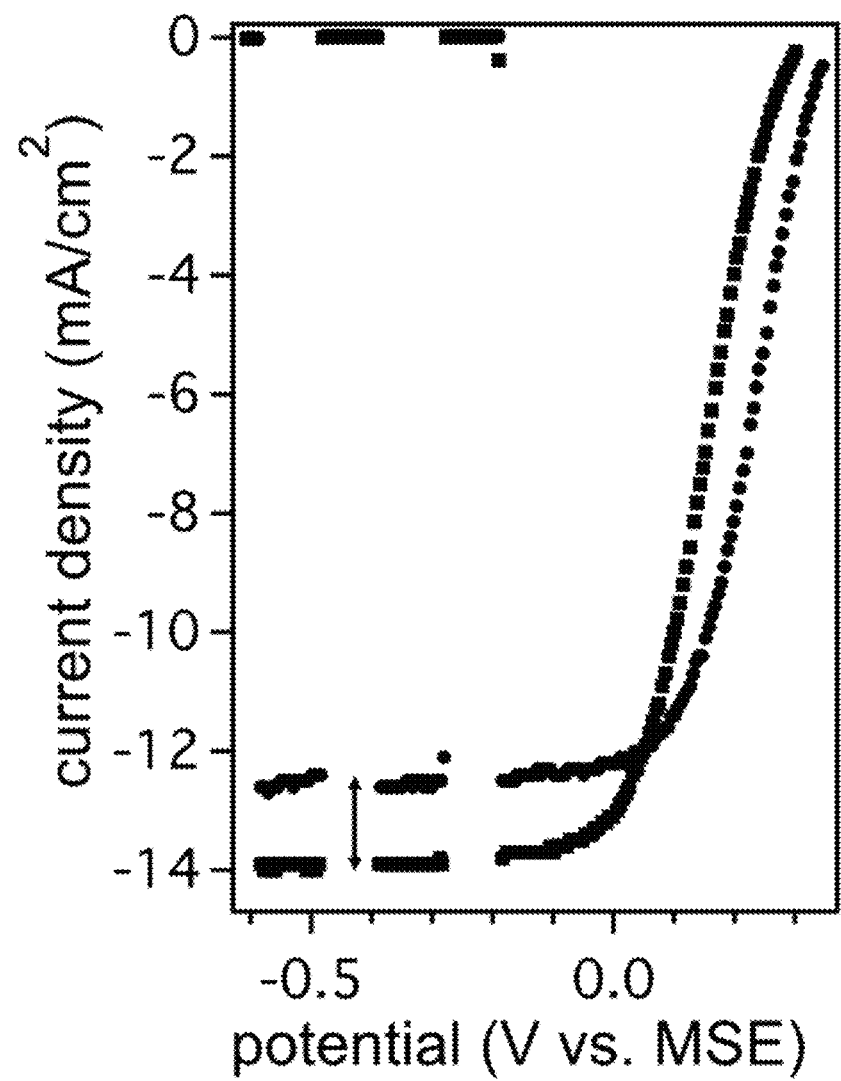
FIG. 12 illustrates and measurements of photocurrent inflation caused by optical concentration from the PEC cell interfaces, according to some embodiments of the present disclosure.

Optical concentration of diverging solar simulators by PEC cell interfaces: Direct solar illumination, being nearly collimated, is necessary to mitigate the optical concentration effect that PEC cell interfaces have on diverging beam solar simulators. The PEC cell concentration effect and geometry for calculating the concentration ratio (CR) is depicted in FIGS. 12 and 11, respectively. The CR is a function of divergence angle ($\theta_0$), sample dimensions $A_0$, PEC cell window thickness $t_g$, and electrolyte path length $t_e$. FIG. 11 illustrates a light source 1100 where the light is transmitted through air 1110, glass 1120, and an electrolyte 190. Referring to FIG. 12, the data set marked with circles refers to a divergence angle of zero degrees, and the data set marked with squares to a divergence angle of seven degrees. The seven degree light source inflated the current by a factor of 1.1.

The effect is relevant since solar simulator intensity calibration should be performed in the absence of a PEC cell. Once the intensity is set and PEC cell moved in to position, the incident flux density on the sample will be inflated by the factor CR. Some methodologies calibrate simulator intensity with the reference cell inside either a 1) dry PEC cell or 2) electrolyte-filled PEC cell, but this also has significant pitfalls in that 1) two air/glass interfaces having ~5% reflectance are present in a dry cell, one of which is replaced after filling with electrolyte by a glass/electrolyte interface having only ~0.4% reflectance, inflating the calibration by ~5% and 2) parasitic light absorption by the electrolyte, especially for wavelengths relevant to commonly used Si reference cells, leads to an overcompensated simulator intensity. In contrast, the nearly collimated illumination of on-sun, direct-beam illumination through a collimating tube mitigates this effect to CR=1.0045, as compared some high-end solar simulators specified to a 4° divergence half angle that would inflate photocurrent by a factor CR=1.09 (assuming $A_0$=0.16 cm², $t_e$=0.3 cm, $t_g$=0.2 cm).

Figure 19:
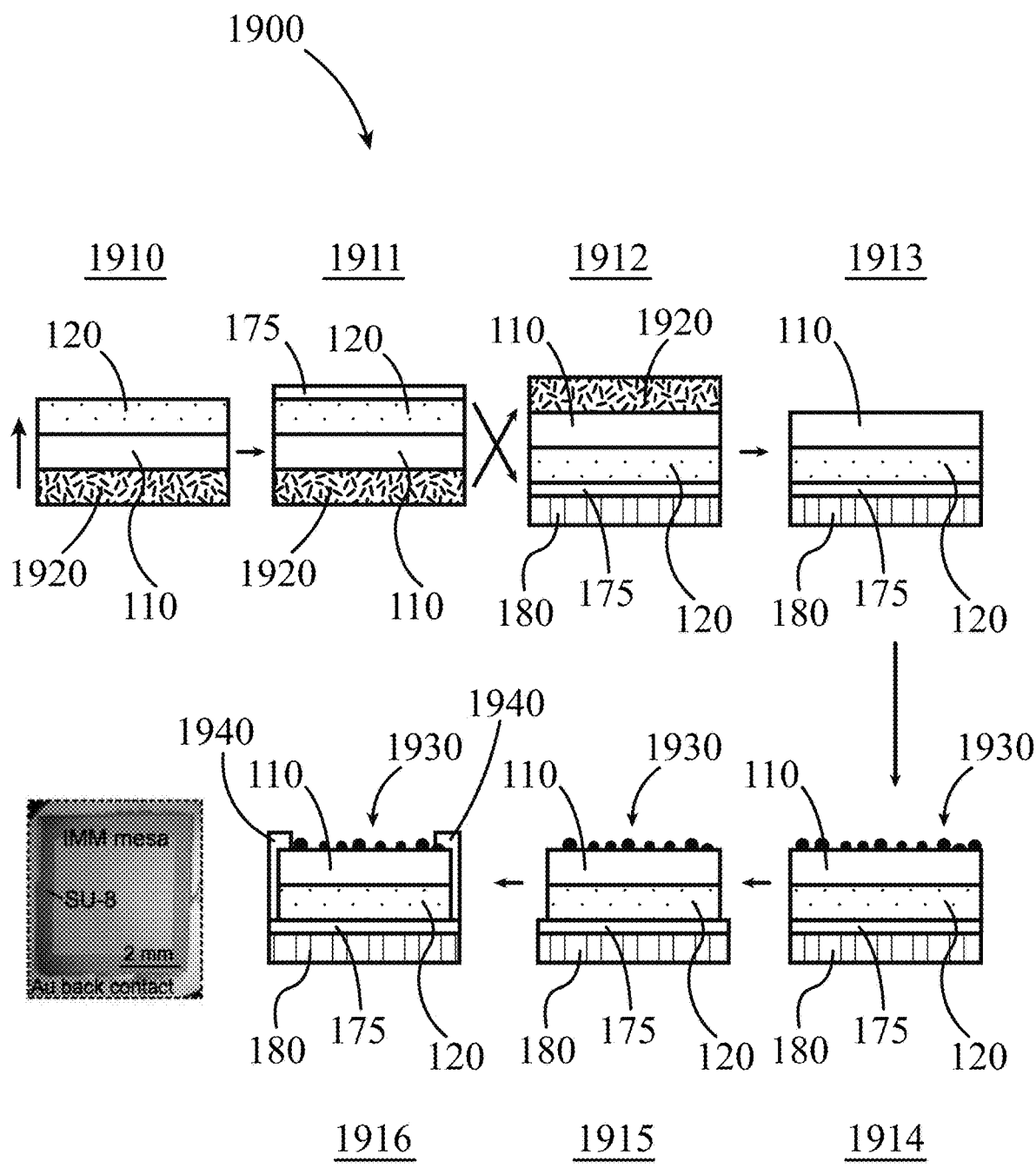
FIG. 19 illustrates a cross-section schematic of device processing and photoelectrode assembly, according to some embodiments of the present disclosure. The transparent graded buffer layer is not shown in this example.

Device growth and processing: FIG. 19 illustrates a method 1900 for produce photocathodes as described above. The method 1900 may begin with the epitaxial growth 1910 of a first cell 110 onto a substrate 1920 and subsequently the epitaxial growth 1910 of the a second cell 120 onto the first cell 110. The method may also include the epitaxial growth of a passivating layer onto the final surface of the first cell 110 and a capping layer onto the passivating layer (step not shown in FIG. 19; due to device inversion as prior steps during the growth process). The method 1900 may then continue with the electrodepositing 1911 of a back reflector 175 onto the second cell 120, followed by an inverting and mounting 1912 step, where the back reflector 175 is physically attached to a handle 180, for example through the use of an adhesive (not shown). Next, first cell 110 may be exposed by the removing 1913 of the substrate 1920. Next, sputtering 1914 may be used to deposit a catalyst 1930 onto the exposed surface of at least one of the first cell 110, the passivating layer (not shown), and/or the capping layer (not shown). The method 1900 may then proceed to etching 1915 at least a portion of catalyst 1930, the first cell 110, and the second cell 120 away. Finally, the method 1900 may concluding by encapsulating 1916 at least the sides of the first cell 110 and the second cell 120 and the back reflector 175 in an encapsulating layer 1940.

In some embodiments of the present disclosure, elements of first electrodes were grown by ambient pressure metalorganic vapor phase epitaxy (AP-MOVPE) (1910). The reagents included trimethylgallium, triethylgallium, trimethylindium and trimethylaluminum for the group IIIs; arsine and phosphine for the group Vs; and diethylzinc, disilane, hydrogen selenide and carbon tetrachloride for the dopants. Samples were grown on single-side polished, silicon-doped (001) GaAs substrates, miscut 4° toward ≤111>B. In some embodiments of the present disclosure, other miscut angles may be used; e.g. 6°. The background hydrogen flow was about 6 standard liters per minute (SLPM). Epilayers were deposited by the epitaxial growth 1910 at growth temperatures ranging from 570-700° C., growth rates ranging from 2-7 μm/hour, and V/III ratios ranging from 10-700.

Post-growth processing proceeded by first electrodepositing 1911 the back reflector/contact and then bonding the sample to an undoped silicon handle 175 with Loctite TRA-BOND 931-1 low viscosity epoxy (e.g. adhesive). The substrate 1920 was then removed by etching 1915 in a solution of $NH_4OH:H_2O_2$ (1:2 by volume). By the etching 1915, the semiconductor electrode structures were mesa-isolated into 4 mm×4 mm squares using standard cleanroom photolithography techniques. A Shipley 1818 positive photoresist was used to form an etch mask, concentrated hydrochloric acid to etch the phosphide-based materials, and a solution of $H_3PO_4:H_2O_2:H_2O$ (3:4:1 by volume) to etch the arsenide-based materials. (See FIG. 19.)

Figure 13:
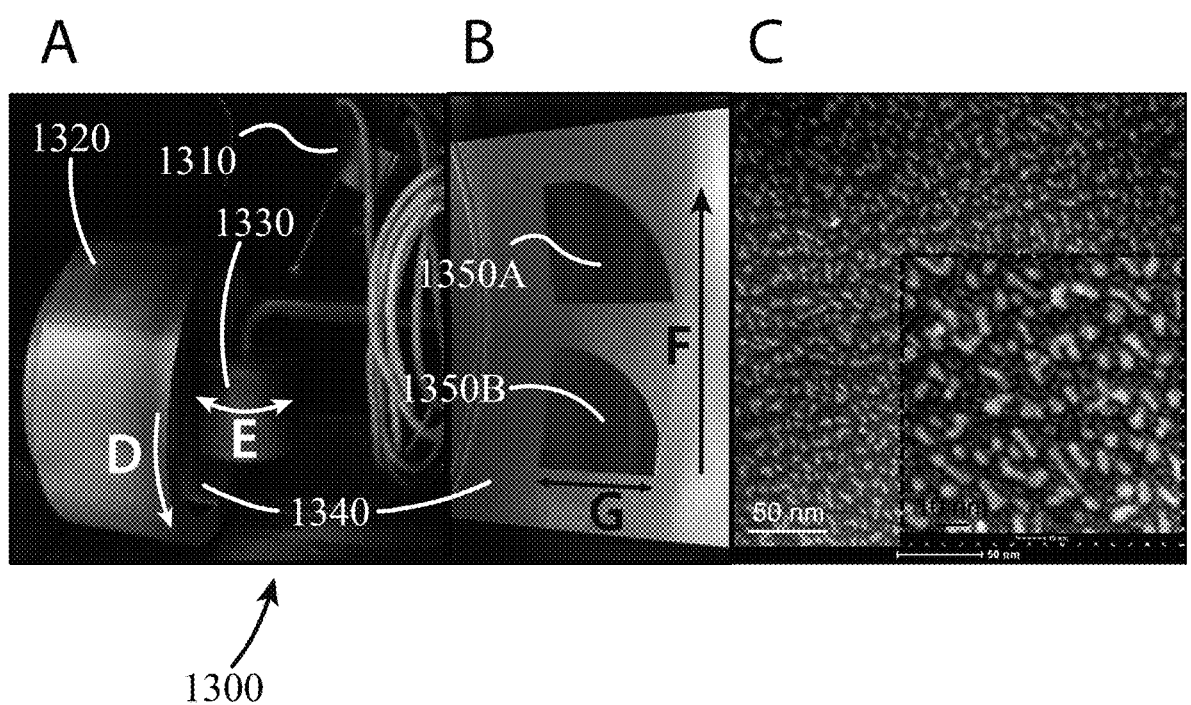
FIG. 13 illustrates (Panel A) a system that includes a vacuum chamber configuration for flash sputtering of PtRu cocatalyst, (Panel B) sample stage top view, and (Panel C) plan view HAADF-STEM of photoelectrode surface showing resulting distribution of 2-5 nm PtRu particles (bright areas), according to some embodiments of the present disclosure.

The PtRu co-catalyst was deposited via flash sputtering 1914 in a custom vacuum chamber system 1300, as shown in FIG. 13. Referring to Panel A of FIG. 13, the system 1300 includes an ion gun 1310, a wheel 1320, a sputter head 1330, and a sample stage 1340. Panel B of FIG. 13 illustrates a first sample 1350A and a second sample 1350B positioned on the sample stage 1340. Panel C of FIG. 13 illustrates high-angle annular dark-field imaging in a scanning transmission electron microscope (HAADF-STEM) image of photoelectrode surface. The photoelectrode samples were mounted to the inside of a drum that rotates on an axis perpendicular to the treatment plane (see FIG. 13). PtRu co-catalyst deposition was performed via room-temperature DC sputtering in a custom-built vacuum chamber having a base pressure of approximately $1\times10^{-6}$ torr. In some embodiments of the present disclosure, each sample was placed on a rotating stage approximately 8" beneath the sputtering target of $Pt_{0.5}Ru_{0.5}$ alloy that was blocked by a shutter except during active deposition. Before deposition, ultra-high purity argon gas was introduced and maintained at 10 mTorr background pressure. The sputter head power supply was set to 20 W DC establishing an Ar plasma that was allowed to stabilize for two minutes before actuating the shutter and exposing the sample to the sputtering plume for a duration of two seconds, completing the PtRu deposition. When rotating, the samples passed through the sputter plume at controlled rate (15 rpm) and number (twice), allowing very brief or "flash" exposure, such that ultra-low catalyst loading is achieved. Quantified by inductively coupled plasma mass spectrometry (ICP-MS) after sample digestion in aqua regia, in some embodiments, the PtRu loading was equivalent to a ~0.3-nm thick film if the catalyst is assumed to be present as a dense and continuous layer.

After mesa isolation (etching 1915) and PtRu deposition (sputtering 1914), the first electrode was partially encapsulated in an encapsulating 1916 step using a SU-8 transparent dielectric epoxy to form an encapsulating layer 1940. The SU-8 mask was designed so that the SU-8 would cover most of the back gold, the mesa sidewalls, and a 0.5 mm perimeter around the mesa top, thereby leaving a 3 mm×3 mm square region of semiconductor exposed to the electrolyte. However, carriers are still generated under the SU-8 because of its high transparency, and those carriers are still collected by the electrolyte because of the low sheet resistance of the semiconductor. Therefore, the active area of the device for the purposes of the rIsTH calculation was 4 mm×4 mm=0.16 $cm^2$. The first electrode was mounted to a glass slide as a secondary handle and electrical lead to the back contact was made via colloidal Ag liquid (PELCO® 16031) and Cu tape (3M #1181) that were insulated from the electrolyte by Kapton tape and Hysol 9462 epoxy. For characterization, the photoelectrode and 3 M sulfuric acid (OmniTrace®, EMD Millipore) electrolyte was contained in a PEC cell with quartz window having an external anti-reflective coating consisting of drop-cast Teflon AF solution.

Conceptual band alignment and bending model for p-GaInP and n/p-GaInP: The conduction band of p-GaInP aligns to ~0.6 V above the $H^+/H_2$ hydrogen evolution reaction (HER) redox potential $E_{HER}$ (vertical arrow in Panel A of FIG. 8). Since a kinetic overpotential of only ~0.05 V is required to drive the HER on a Pt-catalyzed surface, the excess 0.55 V overpotential is a photovoltage loss resulting from the band edge misalignment at the electrolyte 190. Lowering the band alignment and potential at which electrons transfer to the electrolyte 190 decreases this loss. The conceptual model of n/p-GaInP first cell 110 having a p-layer 112 and an n-layer 114 (Panel B of FIG. 8) shows that a near-electrolyte, heavily doped n-type layer 114 introduces sharp, upward band bending characteristic of first electrodes 110 (e.g. photoanodes). This lowers the conduction band, creating conditions that may allow electron transfer to the electrolyte 190 at lower overpotential via tunneling for a sufficiently thin potential barrier. The upward band bending and barrier width may be tuned via the thickness and doping density of the n-type layer 114 of the GaInP first electrode 100.

Figure 14:
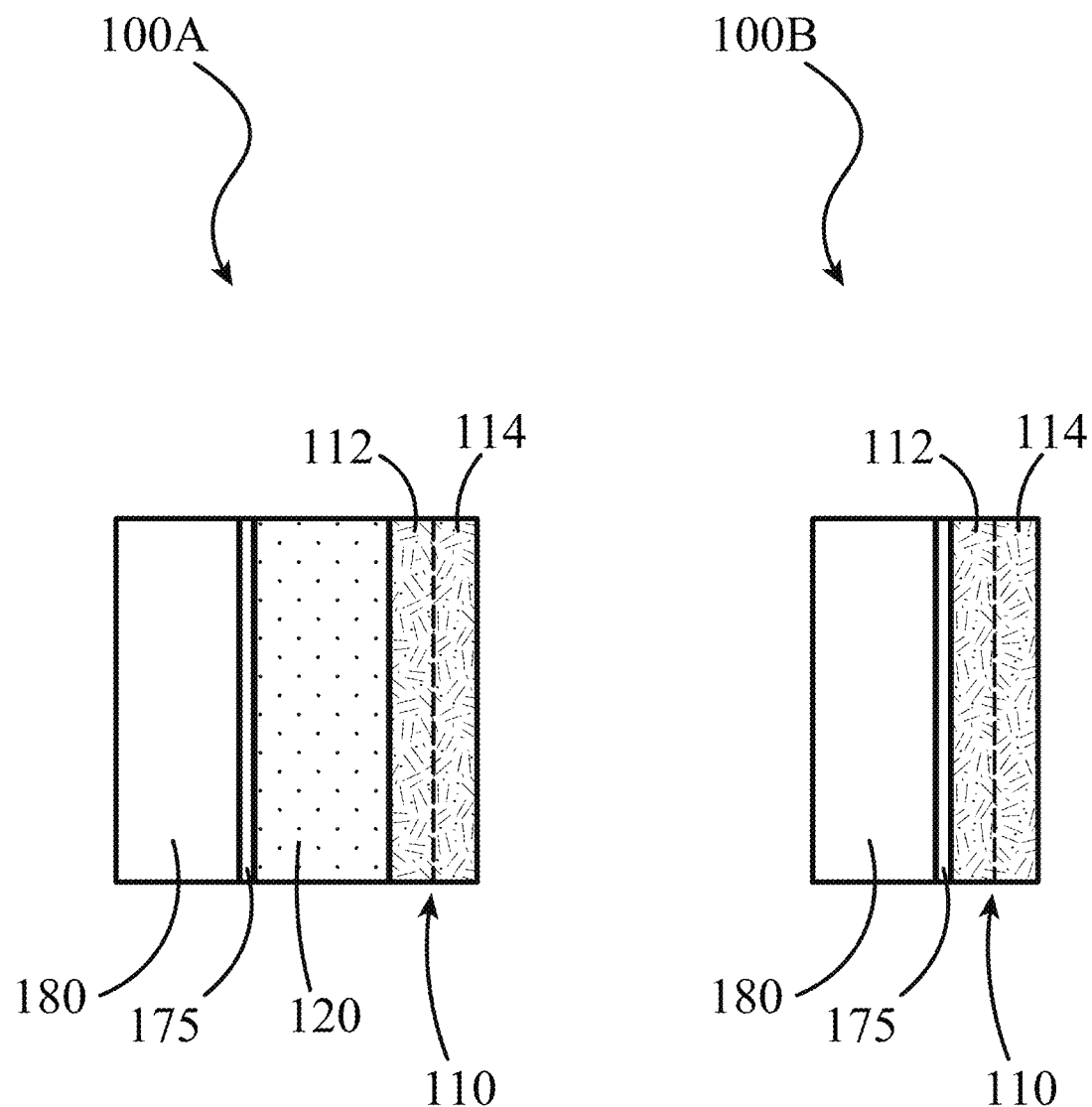
FIG. 14 illustrates (left) an IMM-pn photocathode device and (right) GaInP-pn first cell test structure, according to some embodiments of the present disclosure.

Buried junction optimization and band bending: For buried junction development, the IMM-pn device (Example 3) was simplified from device 100A of FIG. 14 having a first cell 110 with a p-layer 112 and an n-layer 114 to the first cell 110 only first electrode structure of device 100B of FIG. 14 where the first electrode 100B was constructed of GaInP having a p-layer 112 and an n-layer 114. The thickness and doping density (n) of the GaInP n-layer 140 was then varied in device 100B, the layer that contacts the electrolyte (not shown). All samples included PtRu catalyst at the surface of the n-layer of the first cell 110 and where processed as described above.

Figure 15:
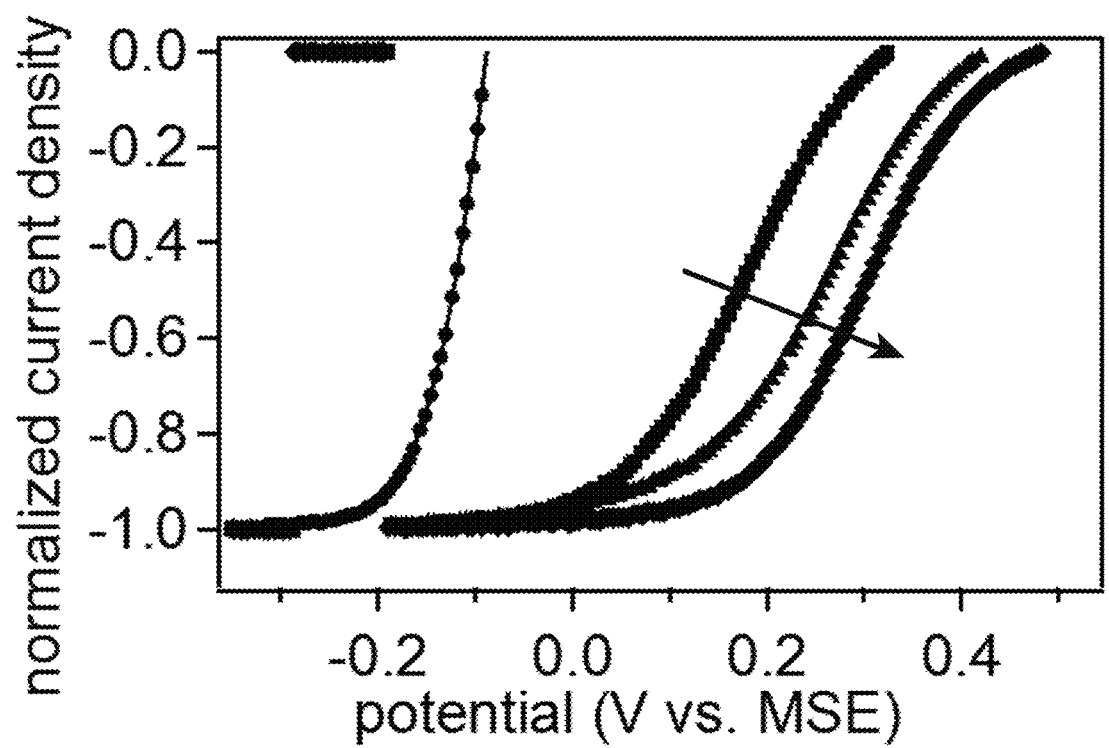
FIG. 15 illustrates the I-V performance for the GaInP-pn first cell of FIG. 14, versus the n-GaInP layer thickness, according to some embodiments of the present disclosure.
Figure 16:
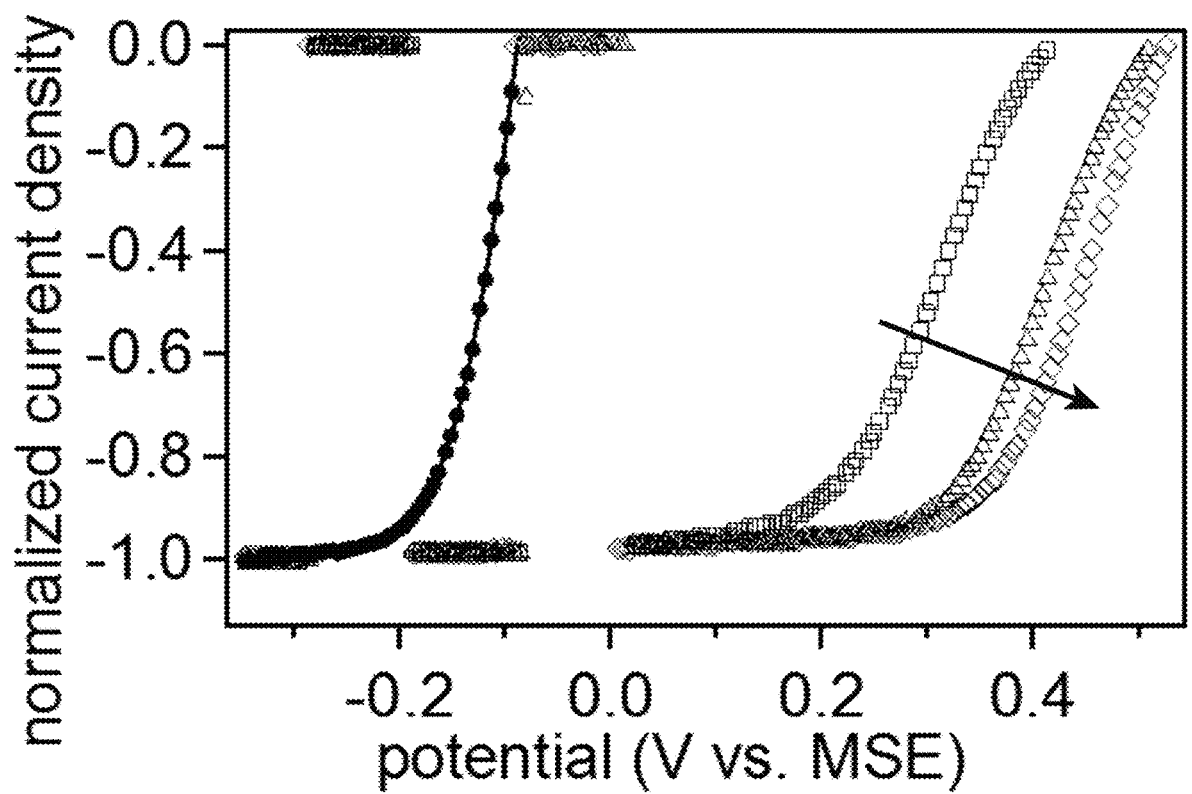
FIG. 16 illustrates the I-V performance for the GaInP-pn first cell of FIG. 14, versus the n-GaInP layer doping density, according to some embodiments of the present disclosure.

In FIG. 15, the test structures with n-GaInP (n≈$10^{18}$ $cm^{-3}$) thicknesses ($t_n$) of 0, 10, 18, and 25 nm (circles, squares, triangles, and diamonds respectively, with the arrow pointing in the direction of increasing thickness) showed increasing photovoltage, approaching saturation at about 25 nm. In FIG. 16, the doping density (n) of 25-nm thick n-GaInP was varied ($2.5\times10^{18}$, $4.4\times10^{18}$, $7.1\times10^{18}/cm^3$ represented by squares, triangles, and diamonds respectively), showing near photovoltage saturation for n=$7.1\times10^{18}$ $cm^{-3}$. This final result represents a photovoltage improvement of nearly 0.6 V over traditional p-GaInP photocathodes that have uniform p-type doping through their bulk (data set with solid circle markers in FIGS. 15 and 16).

Previous work suggested that buried junction "PEC" devices form a simple Ohmic contact at the electrolyte, but did not consider the upward banding of the n-type layer. The wide range of photovoltages here might suggest that junction formation is more complicated. The photovoltage trends were analyzed against equilibrium (no illumination) band bending calculations for three n-GaInP thicknesses and doping densities. Boundary conditions of the semiconductor/electrolyte interface assume fixed band edges and Fermi level equilibration to $E_{HER}$.

Figure 17:
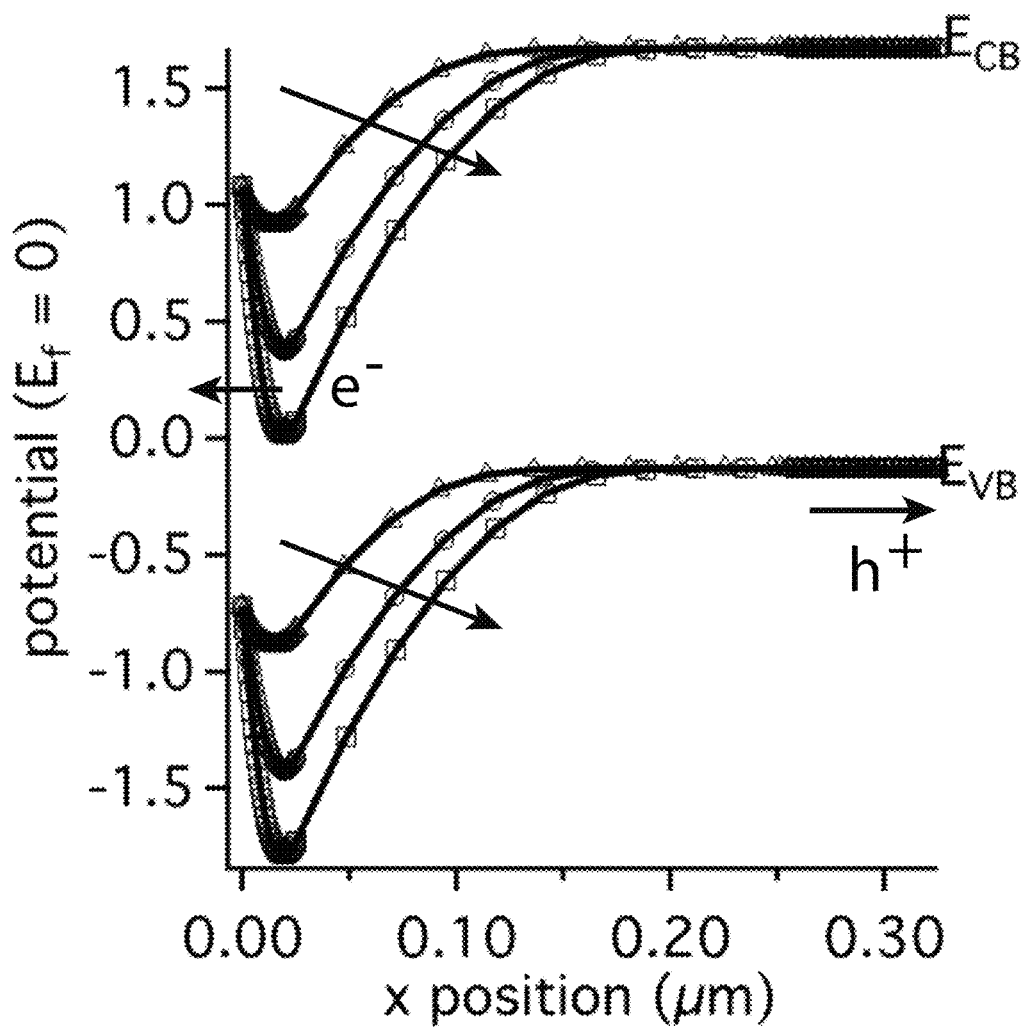
FIG. 17 illustrates equilibrium band bending trends for n/p-GaInP vs. n-GaInP thickness, according to some embodiments of the present disclosure. The electrolyte interface is at x=0.
Figure 18:
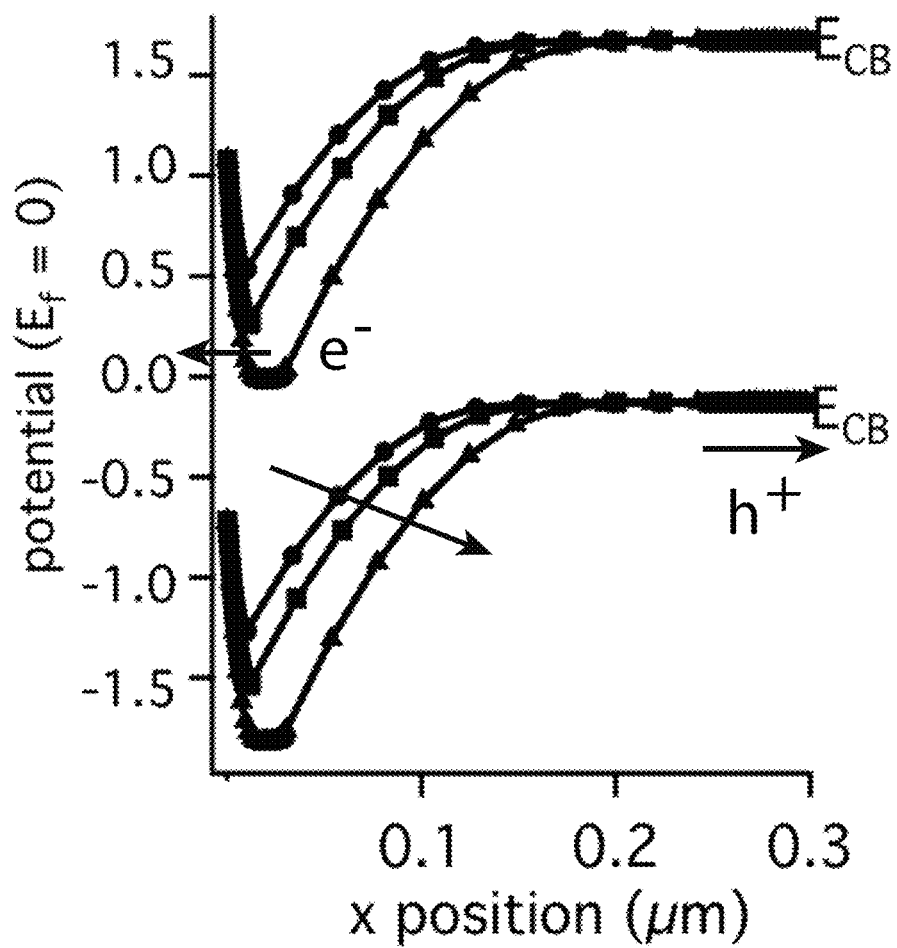
FIG. 18 illustrates equilibrium band bending trends for n/p-GaInP vs. n-GaInP doping density, according to some embodiments of the present disclosure. The electrolyte interface is at x=0.

FIGS. 17 and 18 show increasing band bending that lowers the conduction band. The conduction band is closest to $E_{HER}$ for increasing $t_n$, but will not extend further below the Fermi level and instead the conduction band trough widens, which may explain the photovoltage saturation also occurring around $t_n$=25 nm. For increasing doping density, the conduction band trough also lowers, but instead of widening, shifts closer to the electrolyte. This decreases the barrier width where more efficient electron tunneling could explain the photovoltage improvement with increasing doping density. (Referring to FIGS. 17 and 18, the arrows indicate the direction of increasing thickness and doping respectively. FIG. 17 shown increasing thickness; 10 nm, 18 nm, and 25 nm represented by triangles, circles, and squares respectively. FIG. 18 shows increasing doping; $1\times10^{18}$, $2\times10^{18}$, and $5\times10^{18}/cm^3$ represented by triangles, circles, and squares respectively.)

I-V performance of IMM-AlGaAs: The IMM-AlGaAs device of Example 5 (see Table 1) provided a proof-of-principle for higher-yet efficiencies.

Durability testing: Durability testing was performed in a two-electrode, short-circuit measurement using a $RuO_x$ counter electrode with simulated solar illumination set to 1 Sun by a GaInP (1.8 eV bandgap) reference cell. For demonstration only, results are shown for a three-electrode durability test that appears significantly better, but is not suitable for benchmarking because it does not represent unassisted water-splitting (see FIG. 10).

Faradaic Efficiency confirmation for IMM-pnw device: Hydrogen and oxygen gas were collected and measured using a Hoffman apparatus. The Faradaic Efficiency $\eta_{H_2}$ was calculated as:

$$\eta_{H_2} = \frac{\left(\frac{P_{H_2}V}{RT}\right)}{(\text{Coulombs Passed})*\left(\frac{mole^-}{96485\ C}\right)*\left(\frac{1\ mol H_2}{2\ mole^-}\right)}$$

where $P_{H_2}$ is the pressure from the evolved $H_2$, V is the volume, R is the gas constant (0.08206 (L*atm/K*mol)) and T is temperature in Kelvin. Adjustment to $P_{H_2}$ from atmospheric pressure $P_{atm}$ measured with a barometer was made by subtracting out the water vapor pressure $P_{H_2O\ Vapor}$ and the pressure contribution from the suspended solution $P_{suspended}$:

$$P_{H_2} = P_{atm} - P_{H_2O\ Vapor} - P_{suspended}$$

$P_{suspended}$ is calculated by measuring the height $h_1$ of the suspended solution above the solution level in the PEC cell.

$$P_{suspended} = h_1 * \frac{Hg\ Density}{Solution\ Density} * 1\frac{atm}{760\ mmHg} = h_1 * 0.0736[torr/mm]$$

tively. This validation indicates the likely presence of systematic error where less than the ideal amount of oxygen is collected, perhaps due to its solubility, which is not accounted for here.

Figure 20:
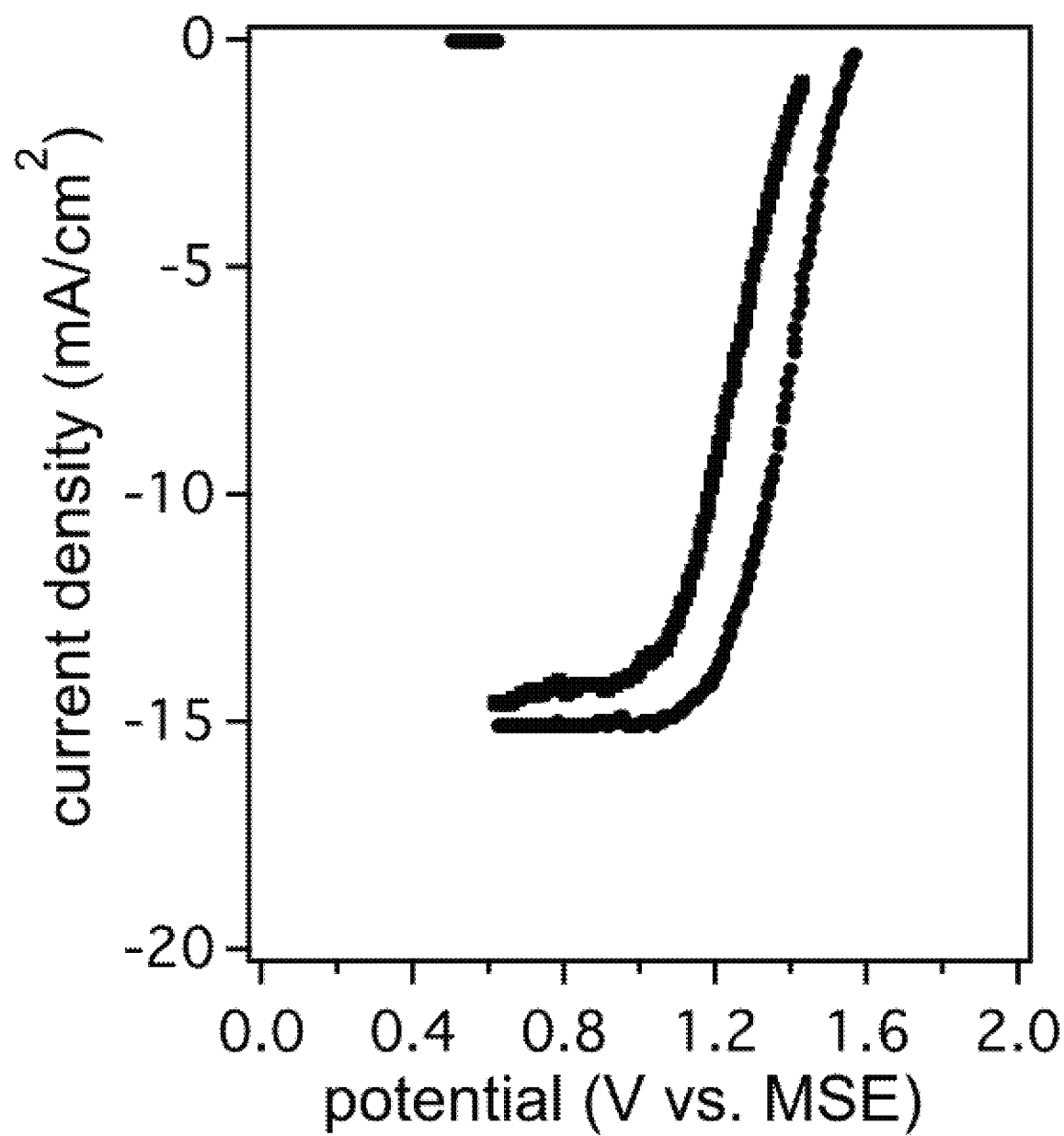
FIG. 20 illustrates current density-voltage data for PEC water-splitting devices having a capping layer of GaInAsP or GaInPN positioned on an AlInP passivating layer, according to some embodiments of the present disclosure.

FIG. 20 illustrates current density-voltage data for IMM PEC water-splitting devices that have either a capping layer consisting of either GaInAsP (solid squares) or GaInPN (empty square) on top of a AlInP passivating layer. The measurements were performed under illumination provided by a tungsten halogen lamp with water-filled filter and light-shaping diffuser. The illumination intensity was adjusted using a GaInP reference cell (1.8 eV bandgap) and matching its short-circuit current to that of its calibration measurement under AM1.5G reference condition. The counter electrode was $RuO_x$ black and placed in a compartment separated from the cathode compartment by a porous glass frit. The counter electrode compartment was filled with electrolyte without surfactant while the main compartment electrolyte had 1 mM Triton X-100 surfactant added. The electrolyte was 0.5M sulfuric acid and a mercury/mercurous sulfate (MSE) reference electrode with 0.5 M sulfuric acid filling solution was used.

Figure 21:
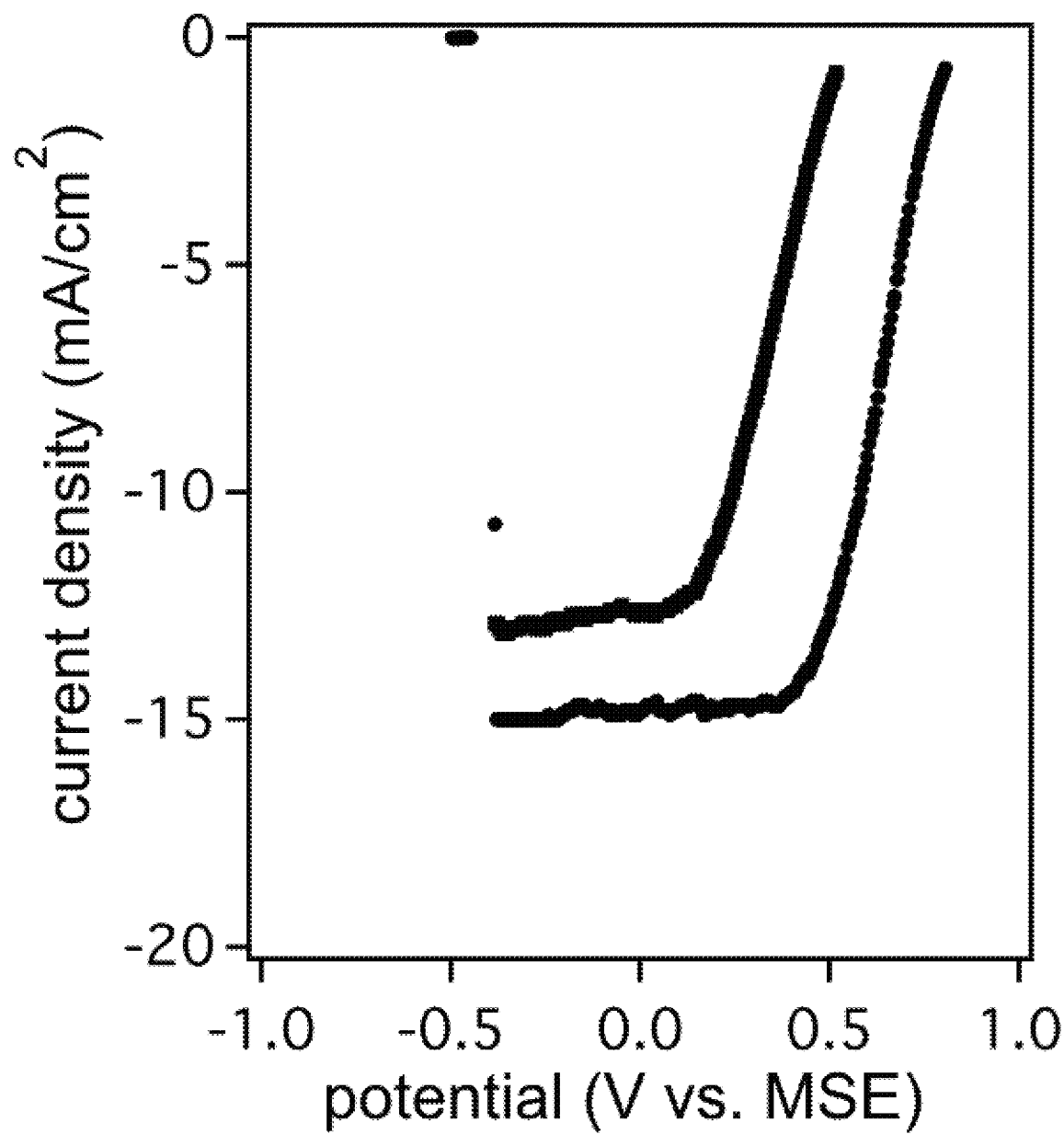
FIG. 21 illustrates current density-voltage data for PEC water-splitting devices having a capping layer of GaInAsP or GaInPN positioned on an AlInP passivating layer, according to some embodiments of the present disclosure.

FIG. 21 illustrates two-electrode current density-voltage data for IMM PEC water-splitting devices that have either a capping layer consisting of either GaInAsP (solid squares) or GaInPN (empty squares) on top of a AlInP passivating layer. The measurements were performed under illumination provided by a tungsten halogen lamp with water-filled filter and light-shaping diffuser. The illumination intensity was adjusted using a GaInP reference cell (1.8 eV bandgap) and matching its short-circuit current to that of its calibration measurement under AM1.5G reference condition. The counter electrode was $RuO_x$ black and placed in a compartment separated from the cathode compartment by a porous glass frit. The counter elelectrode compartment was filled with electrolyte without surfactant while the main compartment electrolyte had 1 mM Triton X-100 surfactant added. The electrolyte was 0.5M sulfuric acid. FIG. 21 demonstrates that these GaInAsP-capped and GaInPN-capped with AlInP passivating layer IMM PEC devices performed water-splitting spontaneously, that is, using light as the only energy input.

Figure 22:
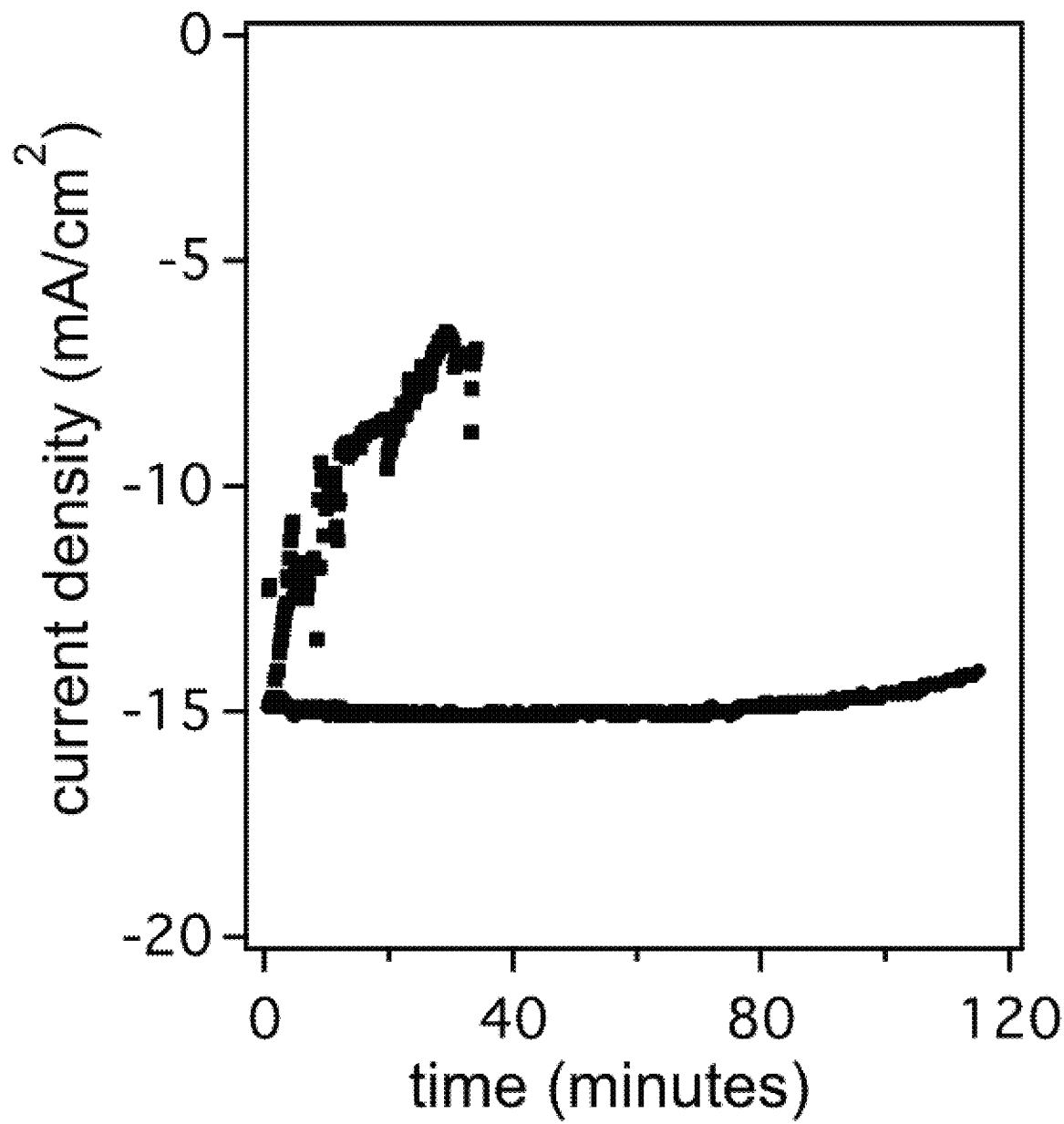
FIG. 22 illustrates current density-voltage data for PEC water-splitting devices having a capping layer of GaInAsP or GaInPN positioned on an AlInP passivating layer, according to some embodiments of the present disclosure.

FIG. 22 illustrates two-electrode, short-circuit stability data for IMM PEC water-splitting devices that have either a capping layer consisting of either GaInAsP (solid squares) or GaInPN (empty squares) on top of a AlInP passivating layer. The measurements were performed under illumination provided by a tungsten halogen lamp with water-filled filter and

TABLE 2

Values for determining Faradaic Efficiency of an IMM-pnw device

|   | Duration (s) | Total charge passed (C) | Expected gas quantity (mol) | Measured gas volume (mL) | $h_1$ (mm) | T (K.) | P (hPa) | Calculated gas quantity (mol) | Faradaic efficiency | Faradiac efficiency from Pt electrodes |
|---|---|---|---|---|---|---|---|---|---|---|
| $H_2$ | 3600 | −7.96 | 4.11E−5 | 1.25 | 45 | 294 | 830 | 4.08E−5 | 0.99 | 0.99 ± 0.01 |
| $O_2$ | 3600 | −7.96 | 2.06E−5 | 0.61 | 98 | 294 | 830 | 1.98E−5 | 0.96 | 0.96 ± 0.02 |

Five faradic efficiency measurements for electrolysis across Pt wire (Premion®, 99.997%) cathode and anode served to validate this methodology, giving $\eta_{H_2}$=0.99 and $\eta_{O_2}$=0.96 with standard deviations of 0.01 and 0.02, respeclight-shaping diffuser. The illumination intensity was adjusted using a GaInP reference cell (1.8 eV bandgap) and matching its short-circuit current to that of its calibration measurement under AM1.5G reference condition. The counter electrode was RuOx black and placed in a compartment separated from the cathode compartment by a porous glass frit. The counter elelectrode compartment was filled with electrolyte without surfactant while the main compartment electrolyte had 1 mM Triton X-100 surfactant added. The electrolyte was 0.5M sulfuric acid. FIG. 22 demonstrates the stability of GaInAsP-capped and GaInPN-capped PEC IMM devices, having AlInP passivating layers, during spontaneous water-splitting.

EXAMPLES

Example 1

A photoelectrochemical device comprising: a first cell comprising a first semiconductor alloy; a capping layer comprising a second semiconductor alloy; and a passivating layer comprising a third semiconductor alloy, wherein: the passivating layer is positioned between the first cell and the capping layer, and at least a portion of the capping layer is configured to be in direct contact with an electrolyte.

Example 2

The photoelectrochemical device of Example 1, wherein the second semiconductor alloy comprises a first Group III-V alloy.

Example 3

The photoelectrochemical device of Example 2, wherein the first Group III-V alloy comprises at least one of a binary alloy, a tertiary alloy, or a quaternary alloy.

Example 4

The photoelectrochemical device of Example 3, wherein: the first Group III-V alloy comprises $A_xB_yE_{(1-x-y)}C$ or $AC_xD_yF_{(1-x-y)}$, A is a first Group III element, B is a second Group III element, E is a third Group III element, C is a first Group V element, D is a second Group V element, F is a third Group V element, $0 \le x \le 1$, and $0 \le y \le 1$.

Example 5

The photoelectrochemical device of Example 4, wherein the first Group III-V alloy comprises at least one of BN, BP, BAs, AlN, AlP, AlAs, AlSb, GaN, GaP, GaAs, GaSb, InN, InP, InAs, InSb, AlInSb, GaAsN, GaAsP, GaAsSb, AlGaN, AlGaP, InGaN, InAsSb, InGaSb, GaInP, AlInP, GaSbP, AlGaInP, AlGaAsP, InGaAsP, InGaAsSb, InAsSbP, AlInAsP, AlGaAsN, InGaAsN, InAlAsN, or GaAsSbN.

Example 6

The photoelectrochemical device of Example 4, wherein the first Group III-V alloy comprises $Ga_xIn_{(1-x)}P$, $Ga_xIn_{(1-x)}As_yP_{(1-y)}$, or $GaSb_xP_{(1-x)}$.

Example 7

The photoelectrochemical device of Example 6, wherein the first Group III-V alloy comprises $Ga_{0.51}In_{0.49}P$, $Ga_{0.68}In_{0.32}As_{0.34}P_{0.66}$, or $GaSb_{0.31}P_{0.69}$.

Example 8

The photoelectrochemical device of Example 4, wherein the first Group III-V alloy further comprises at least one of selenium, tellurium, sulfur, or silicon.

Example 9

The photoelectrochemical device of Example 4, wherein the first Group III-V alloy is n-type.

Example 10

The photoelectrochemical device of Example 1, wherein the third semiconductor alloy comprises a second Group III-V alloy.

Example 11

The photoelectrochemical device of Example 10, wherein the second Group III-V alloy comprises at least one of a binary alloy, a tertiary alloy, or a quaternary alloy.

Example 12

The photoelectrochemical device of Example 11, wherein: the second Group III-V alloy comprises $G_uH_vI_{(1-u-v)}J$ or $GJ_uK_vL_{(1-u-v)}$, G is a fourth Group III element, H is a fifth Group III element, I is a sixth Group III element, J is a fourth Group V element, K is a fifth Group V element, L is a sixth Group V element, $0 \le u \le 1$, and $0 \le v \le 1$.

Example 13

The photoelectrochemical device of Example 12, wherein the second Group III-V alloy comprises at least one of BN, BP, BAs, AlN, AlP, AlAs, AlSb, GaN, GaP, GaAs, GaSb, InN, InP, InAs, InSb, AlInSb, GaAsN, GaAsP, GaAsSb, AlGaN, AlGaP, InGaN, InAsSb, InGaSb, GaInP, AlInP, GaSbP, AlGaInP, AlGaAsP, InGaAsP, InGaAsSb, InAsSbP, AlInAsP, AlGaAsN, InGaAsN, InAlAsN, or GaAsSbN.

Example 14

The photoelectrochemical device of Example 13, wherein the second Group III-V alloy comprises $Al_uIn_{(1-u)}P$.

Example 15

The photoelectrochemical device of Example 14, wherein the second Group III-V alloy comprises $Al_{0.53}In_{0.47}P$.

Example 16

The photoelectrochemical device of Example 12, wherein the second Group III-V alloy further comprises at least one of selenium, tellurium, sulfur, or silicon.

Example 17

The photoelectrochemical device of Example 12, wherein the second Group III-V alloy is n-type.

Example 18

The photoelectrochemical device of Example 1, wherein: the first cell comprises an n-layer and a p-layer, and the n-layer is between the p-layer and the passivating layer.

Example 19

The photoelectrochemical device of Example 1, wherein the first semiconductor alloy comprises $Ga_xIn_{(1-x)}P$ or $Al_xGa_{(1-x)}As$ and $0 \leq x \leq 1$.

Example 20

The photoelectrochemical device of Example 19, wherein the first semiconductor alloy comprises $Ga_{0.51}In_{0.49}P$ or $Al_{0.23}Ga_{0.77}As$.

Example 21

The photoelectrochemical device of Example 1, further comprising: a second cell comprising a fourth semiconductor alloy; and a buffer layer comprising a fifth semiconductor alloy, wherein: the buffer layer is positioned between the first cell and the second cell.

Example 22

The photoelectrochemical device of Example 21, wherein the fourth semiconductor alloy comprises GaAs or $Ga_xIn_{(1-x)}As$ and $0 \leq x \leq 1$.

Example 23

The photoelectrochemical device of Example 22, wherein the fourth semiconductor alloy comprises $Ga_{0.89}In_{0.11}As$.

Example 24

The photoelectrochemical device of Example 21, wherein the buffer layer comprises a compositionally graded buffer layer.

Example 25

The photoelectrochemical device of Example 21, wherein: the fifth semiconductor alloy comprises $Al_{(1-x-y)}Ga_xIn_yAs$ or $Al_{(1-x-y)}Ga_xIn_yP$, $0 \leq x \leq 1$, and $0 \leq y \leq 1$.

Example 26

The photoelectrochemical device of Example 24, wherein the compositionally graded buffer layer comprises between 2 and 20 layers.

Example 27

The photoelectrochemical device of Example 25, wherein each layer of the compositionally graded buffer layer has a thickness between $0.5 \mu$ and $4 \mu m$.

Example 28

The photoelectrochemical device of Example 1, wherein the first cell has a thickness between $0.5 \mu m$ and $2 \mu m$.

Example 29

The photoelectrochemical device of Example 1, wherein the passivating layer may have a thickness between 10 nm and 20 nm.

Example 30

The photoelectrochemical device of Example 1, wherein the capping layer may have a thickness between 10 nm and 20 nm.

Example 31

The photoelectrochemical device of Example 21, further comprising: a back reflector; and a handle, wherein: the back reflector is positioned between the handle and the second cell.

Example 32

The photoelectrochemical device of Example 31, wherein the back reflector comprises at least one of silver or gold.

Example 33

The photoelectrochemical device of Example 32, wherein the back reflector has a thickness between $1 \mu m$ and $3 \mu m$.

Example 34

The photoelectrochemical device of Example 31, wherein the handle comprises at least one of silicon, glass, or a metal.

Example 35

The photoelectrochemical device of Example 34, wherein the metal is copper.

Example 36

The photoelectrochemical device of Example 31, wherein the handle has a thickness between 0.1 mm and 5 mm.

Example 37

The photoelectrochemical device of Example 1, further comprising an electrolyte, wherein the electrolyte is in physical contact with at least a portion of the capping layer.

Example 38

The photoelectrochemical device of Example 37, wherein the electrolyte comprises a least one of an acid, a base, and a buffer agent.

Example 39

The photoelectrochemical device of Example 38, wherein the acid comprises at least one of $H_2SO_4$, $H_3PO_4$, or $HClO_4$.

Example 40

The photoelectrochemical device of Example 38, wherein the base comprises at least one of NaOH or KOH.

Example 41

The photoelectrochemical device of Example 38, wherein the buffer agent comprises at least one sulfate, phosphate, or carbonate.

The foregoing discussion and examples have been presented for purposes of illustration and description. The foregoing is not intended to limit the aspects, embodiments, or configurations to the form or forms disclosed herein. In the foregoing Detailed Description of Some Embodiments for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description of Some Embodiments, with each claim standing on its own as a separate aspect, embodiment, or configuration.

What is claimed is:

1. A photoelectrochemical device comprising:
    a first cell comprising an n-layer and a p-layer;
    a second cell comprising GaInAs;
    a capping layer comprising a first alloy of n-type $Ga_xIn_{(1-x)}P$; and
    a passivating layer comprising a second alloy of $Al_uIn_{(1-u)}P$, wherein:
    $0<x<1$ and $0<u<1$,
    both the n-layer and the p-layer comprise AlGaAs,
    the n-layer is positioned between the p-layer and the passivating layer,
    the first cell is positioned between the second cell and the passivating layer,
    the passivating layer is positioned between the first cell and the capping layer,
    the capping layer has a thickness between 10 nm and 20 nm, inclusively, and
    at least a portion of the capping layer is configured to withstand direct contact with an electrolyte.

2. The photoelectrochemical device of claim 1, wherein x is about 0.51.

3. The photoelectrochemical device of claim 1, wherein the first alloy further comprises at least one of selenium, tellurium, sulfur, or silicon.

4. The photoelectrochemical device of claim 1, wherein u is about 0.53.

5. The photoelectrochemical device of claim 1, wherein the second alloy further comprises at least one of selenium, tellurium, sulfur, or silicon.

6. A method for producing a photoelectrochemical device, the method comprising:
    growing by an epitaxial method a first cell comprising an n-layer and a p-layer on a substrate;
    growing by an epitaxial method a second cell comprising GaInAs on the first cell;
    attaching the second cell to a handle;
    removing the substrate from the first cell, resulting in the exposing of a surface of the first cell;
    depositing a passivating layer comprising a first alloy of $Al_uIn_{(1-u)}P$ on the surface; and
    depositing a capping layer comprising a second alloy of n-type $Ga_xIn_{(1-x)}P$ on the passivating layer, wherein:
    $0<x<1$ and $0<u<1$,
    both the n-layer and the p-layer comprise AlGaAs,
    the n-layer is positioned between the p-layer and the passivating layer,
    the capping layer has a thickness between 10 nm and 20 nm, inclusively, and
    at least a portion of the capping layer is configured to be in direct contact with an electrolyte.

7. The photoelectrochemical device of claim 1, wherein the passivating layer has a thickness between 10 nm and 20 nm, inclusively.

8. The photoelectrochemical device of claim 1, further comprising: a back reflector comprising at least one of gold or silver, wherein: the second cell is positioned between the back reflector and the first cell.

9. The photoelectrochemical device of claim 1, wherein:
    the second cell further comprises an n-layer and a p-layer,
    both the n-layer and the p-layer of the second cell comprise GaInAs, and
    the n-layer of the second cell is positioned between the p-layer of the second cell and the first cell.

10. The photoelectrochemical device of claim 1, wherein both the n-layer and the p-layer of the first cell comprise about $Al_{0.23}Ga_{0.77}As$.

11. The photoelectrochemical device of claim 9, wherein both the n-layer and the p-layer of the second cell comprise about $Ga_{0.89}In_{0.11}As$.

* * * * *